US007462829B2

(12) United States Patent
Nagahama et al.

(10) Patent No.: US 7,462,829 B2
(45) Date of Patent: Dec. 9, 2008

(54) SUBSTRATE INSPECTION APPARATUS, SUBSTRATE INSPECTION METHOD AND METHOD OF MANUFACTURING SEMICONDUCTOR DEVICE

(75) Inventors: Ichirota Nagahama, Ibaraki (JP); Yuichiro Yamazaki, Tokyo (JP); Takamitsu Nagai, Kanagawa (JP); Motosuke Miyoshi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/723,566

(22) Filed: Mar. 21, 2007

(65) Prior Publication Data

US 2007/0187600 A1     Aug. 16, 2007

Related U.S. Application Data

(62) Division of application No. 10/853,678, filed on May 26, 2004, now Pat. No. 7,211,796.

(30) Foreign Application Priority Data

May 27, 2003   (JP)   ............................ 2003-149172
May 27, 2003   (JP)   ............................ 2003-149416

(51) Int. Cl.
     *H01J 37/244*     (2006.01)
(52) U.S. Cl. ....................................... 250/310
(58) Field of Classification Search .................. 250/310, 250/251; 324/751
See application file for complete search history.

(56) References Cited

U.S. PATENT DOCUMENTS 4,453,086 A    6/1984   Grobman
4,939,360 A    7/1990   Sakai (Continued)

FOREIGN PATENT DOCUMENTS

JP          58-87744       5/1983

(Continued)

OTHER PUBLICATIONS

Decision of Rejection issued by the Japanese Patent Office on Dec. 19, 2006, for Japanese Patent Application No. 2003-149172 and English-language translation.

(Continued)

*Primary Examiner*—Kiet T Nguyen
(74) *Attorney, Agent, or Firm*—Finnegan, Henderson, Farabow, Garrett & Dunner, L.L.P.

(57) ABSTRACT

A substrate inspection apparatus includes: an electron beam irradiation device which emits an electron beam and causes the electron beam to irradiate a substrate to be inspected as a primary beam; an electron beam detector which detects at least one of a secondary electron, a reflected electron and a backscattered electron that are generated from the substrate that has been irradiated by the electron beam, and which outputs a signal that forms a one-dimensional or two-dimensional image of a surface of the substrate; a mapping projection optical system which causes imaging of at least one of the secondary electron, the reflected electron and the backscattered electron on the electron beam detector as a secondary beam; and an electromagnetic wave irradiation device which generates an electromagnetic wave and causes the electromagnetic wave to irradiate a location on the surface of the substrate at which the secondary beam is generated.

10 Claims, 25 Drawing Sheets

U.S. PATENT DOCUMENTS

| | | | |
|---|---|---|---|
| 5,118,941 | A | 6/1992 | Larson |
| 5,432,345 | A | 7/1995 | Kelly |
| 5,444,242 | A | 8/1995 | Larson et al. |
| 5,502,306 | A | 3/1996 | Meisburger et al. |
| 5,576,833 | A | 11/1996 | Miyoshi et al. |
| 5,973,323 | A | 10/1999 | Adler et al. |
| 5,986,263 | A | 11/1999 | Hiroi et al. |
| 6,172,363 | B1 | 1/2001 | Shinada et al. |
| 6,252,412 | B1 | 6/2001 | Talbot et al. |
| 6,465,781 | B1 | 10/2002 | Nishimura et al. |
| 6,661,008 | B2 | 12/2003 | Takagi et al. |
| 6,797,954 | B2 | 9/2004 | Shinada et al. |
| 7,049,585 | B2 * | 5/2006 | Nakasuji et al. ............. 250/310 |
| 7,241,993 | B2 * | 7/2007 | Nakasuji et al. ............. 250/310 |
| 2001/0002697 | A1 | 6/2001 | Hiroi et al. |
| 2002/0100872 | A1 | 8/2002 | Hiroi et al. |
| 2003/0127593 | A1 | 7/2003 | Shinada et al. |

FOREIGN PATENT DOCUMENTS

| | | |
|---|---|---|
| JP | 4-242060 | 8/1992 |
| JP | 7-24939 | 1/1995 |
| JP | 7-86347 | 3/1995 |
| JP | 7-249393 | 9/1995 |
| JP | 10-221269 | 8/1998 |
| JP | 11-132975 | 5/1999 |
| JP | 2000-340160 | 12/2000 |
| JP | 2001-074437 | 3/2001 |
| JP | 2002-31519 | 1/2002 |
| JP | 2002-289659 | 10/2002 |
| JP | 2003-151483 | 5/2003 |
| WO | WO 03/050841 A1 | 6/2003 |

OTHER PUBLICATIONS

Decision of Rejection issued by the Japanese Patent Office on Sep. 1, 2006, for Japanese Patent Application 2003-149416, and English-language translation.

Notification of Reason for Rejection issued by the Japanese Patent Office on May 23, 2006, for Japanese Patent Application No. 2003-149172, and English-language translation.

Notification of Reason for Rejection issued by the Japanese Patent Office on May 16, 2006, for Japanese Patent Application No. 2003-149416, and English-language translation.

Office Action issued by the German Patent Office on Mar. 28, 2006, for German Patent Application No. 10 2004 025 890.2-52, and English-language translation.

Patent Abstracts of Japan, English-language Abstract of Japanese Publication No. 11-132975, filed May 21, 1999.

Tsuno, "Simulation of a Wien Filter as Beam Separator in a Low Energy Electron Microscope," Ultramicroscopy 55 (1994), pp. 127-140.

* cited by examiner

σ = TOTAL SECONDARY ELETRON EMISSION RATIO
δ = SECONDARY ELETRON EMISSION RATIO
η = BACKSCATTERING COEFFICIENT
σ = δ + η

| CASE | PRIMARY BEAM Bp | ELECTRON BEAM E$_{B1}$ | ELECTRON BEAM E$_{B2}$ |
|---|---|---|---|
| 1 | IRRADIATES INSULATOR UNDER NEGATIVE CHARGING CONDITION | × | × |
| 2 | IRRADIATES INSULATOR UNDER NEGATIVE CHARGING CONDITION | IRRADIATES INSULATOR UNDER NEGATIVE CHARGING CONDITION | × |
| 3 | IRRADIATES INSULATOR UNDER NEGATIVE CHARGING CONDITION | IRRADIATES INSULATOR UNDER POSITIVE CHARGING CONDITION | × |
| 4 | IRRADIATES INSULATOR UNDER NEGATIVE CHARGING CONDITION | IRRADIATES INSULATOR UNDER NEGATIVE CHARGING CONDITION | IRRADIATES INSULATOR UNDER POSITIVE CHARGING CONDITION |
| 5 | IRRADIATES INSULATOR UNDER NEGATIVE CHARGING CONDITION | IRRADIATES INSULATOR UNDER POSITIVE CHARGING CONDITION | IRRADIATES INSULATOR UNDER NEGATIVE CHARGING CONDITION |

IRRADIATION CONDITIONS CONDITIONS FOR EACH ELECTRON BEAM

FIG. 13

SUBSTRATE INSPECTION APPARATUS, SUBSTRATE INSPECTION METHOD AND METHOD OF MANUFACTURING SEMICONDUCTOR DEVICE

CROSS REFERENCE TO RELATED APPLICATION

This is a division of Application Ser. No. 10/853,678, filed May 26, 2004 now U.S. Pat. No. 7,211,796, which is incorporated herein by reference.

This application claims benefit of priority under 35USC § 119 to Japanese Patent Applications No. 2003-149172, filed on May 27, 2003, and No. 2003-149416, filed on May 27, 2003, the contents of which are incorporated by reference herein.

BACKGROUND OF THE INVENTION

1. Field of the Invention

The present invention relates to a substrate inspection apparatus, a substrate inspection method, and a method of manufacturing a semiconductor device, with the objective of observing or inspecting, for example, a semiconductor pattern by use of an electron beam.

2. Related Background Art

Methods of inspecting defects in semiconductor patterns with the use of electron beams have recently been developed and are now in use. One such method, disclosed in Japanese Patent Laid Open No. 7-249393 by way of example, involves generating a rectangular electron beam as a primary beam by electron irradiation means and irradiating the specimen therewith, then projecting an enlarged image of secondary electrons and backscattered electrons generated from the specimen surface, as a secondary beam, by mapping projection optical means and obtaining an image of the specimen surface indicative of changes in the shape/properties/potential of the specimen surface by an electron detection means such as an MCP detector. In addition to that method, another method has been proposed in Japanese Patent Laid-Open No. 11-132975, for example, by which the primary beam is deflected by a Wien filter so as to be incident on the specimen surface, and also a secondary beam is allowed to proceed through the same Wien filter and enters mapping optical projection means.

However, the inspection process disclosed in Japanese Patent Laid-Open No. 11-132975 for example has a problem in that, when the primary beam is shone onto the specimen, local differences in the charge state of the specimen surface will be created, depending on the shape and properties of the specimen surface or the layers in the vicinity thereof, and thus the inspection characteristics will deteriorate due to the resultant local differences in potential. This point will now be discussed with reference to the accompanying figures. Note that the same portions in the figures discussed below are denoted by the same reference numbers and description thereof is repeated only when necessary.

As shown in FIG. 27, if there are portions 202 and 204 of mutually different potentials in a surface layer of a specimen S, potential gradients that are not parallel to the surface of the specimen S are generated in regions $R_{D1}$ and $R_{D2}$ above the vicinity of boundary surfaces C1 and C2 between the portions 202 and 204. When the secondary beams that are emitted in the vicinity of the boundaries C1 and C2 are controlled by a secondary optical system of the inspection apparatus to form an image on a detection surface of the detector, these potential gradients will exert an unwanted deflection effect on the secondary beams, hindering appropriate imaging and causing distortion and contrast deterioration in the detected image. This phenomenon is particularly obvious in the inspection of interconnection patterns for large-scale integrated circuits (LSIs). This is because, in LSI interconnections, each portion 202 of FIG. 27 corresponds to e.g. an insulator of $SiO_2$ or the like and the portion 204 corresponds to e.g. a conductor of tungsten (W) or the like, so the charging of each insulator during irradiation by an electron beam will create a large potential difference with respect to the conductor.

Occurrence of such local potential differences is not limited to boundary surfaces between different materials in mutual contact. For example, even if there are insulating portions 214 between the metal wiring 212 on the specimen S of an integrated circuit wafer, as shown in FIG. 28, if the primary beam irradiates with an incident energy (energy of electrons that are directly incident on the specimen S) that gives a total secondary electron emission ratio σ for each insulating portion 214 of 1 or more, the surface of the insulating portion 214 will be positively charged. Such incident energy is about 50 eV to 1 keV if the material of the insulating portion 214 is $SiO_2$, by way of example. In such a case, local potential gradients that are not parallel to the surface of the specimen S are generated in the vicinity of a boundary 216 between the metal wiring 212 and the insulating portion 214. These potential gradients will exert an inappropriate deflection effect on secondary electrons emitted with a low emission energy of no more than a few eV from each of a point P2 within the metal wiring 212 in the vicinity of the boundary 216 and a point P4 within the insulating portion 214 in the vicinity of the boundary 216, before they are imaged on the MCP detector by the secondary optical system. This will make the trajectories of the secondary electrons deviate from electron beam trajectories $TJ_{IP2}$ and $TJ_{IP4}$ that are ideal for accurate mapping projection and curve as shown by trajectories $TJ_{RP6}$ and $TJ_{RP8}$. As a result, accurate imaging of the secondary beam is hindered, raising a problem in that the accuracy of defect detection is adversely affected by distortion and contrast deterioration of the detected image.

In general, the following three characteristics are mainly required of a detected image of a secondary beam, in order to improve the defect inspection capabilities when using electron beams:

1) Distortion must be small;
2) The S/N ratio (the ratio of electrons that contribute to the imaging to noise electrons that do not contribute to the imaging, within the secondary beam signal that arrives at the detector from the material that is the specimen surface) must be large; and
3) The contrast between different materials must be large.

BRIEF SUMMARY OF THE INVENTION

According to a first aspect of the present invention, there is provided a substrate inspection apparatus comprising:

an electron beam irradiation device which emits an electron beam and causes the electron beam to irradiate a substrate to be inspected as a primary beam;

an electron beam detector which detects at least one of a secondary electron, a reflected electron and a backscattered electron that are generated from the substrate that has been irradiated by the electron beam, and which outputs a signal that forms a one-dimensional or two-dimensional image of a surface of the substrate;

a mapping projection optical system which causes imaging of at least one of the secondary electron, the reflected electron and the backscattered electron on said electron beam detector as a secondary beam; and an electromagnetic wave irradiation device which generates an electromagnetic wave and causes the electromagnetic wave to irradiate a location on the surface of the substrate at which the secondary beam is generated.

According to a second aspect of the present invention, there is provided a substrate inspection apparatus comprising:

an electron beam irradiation device which emits an electron beam and causes the electron beam to irradiate a substrate to be inspected that has an insulator formed thereon as a primary beam under a condition such that the insulator is negatively charged;

an electron beam detector which detects at least one of a secondary electron, a reflected electron and a backscattered electron that are generated from the substrate that has been irradiated by the primary beam and which outputs a signal that forms a one-dimensional or two-dimensional image of a surface of the substrate; and a mapping projection optical system which causes imaging of at least one of the secondary electron, the reflected electron and the backscattered electron on said electron beam detector.

According to a third aspect of the present invention, there is provided a substrate inspection method comprising:

emitting an electron beam and causing the electron beam to irradiate a substrate to be inspected as a primary beam;

projecting at least one of a secondary electron, a reflected electron and a backscattered electron that are generated from the substrate that has been irradiated by the electron beam, as a secondary beam to cause imaging of the secondary beam;

detecting an image caused by said imaging of the secondary beam and outputting a signal to form a one-dimensional or two-dimensional image of a surface of the substrate; and generating an electromagnetic wave and causes the electromagnetic wave to irradiate a location on the surface of the substrate at which the secondary beam is generated.

According to a fourth aspect of the present invention, there is provided a substrate inspection method comprising:

emitting an electron beam and causing the electron beam to irradiate a substrate to be inspected that has an insulator formed thereon as a primary beam under a condition such that the insulator is negatively charged;

projecting at least one of a secondary electron, a reflected electron and a backscattered electron that are generated from the substrate that has been irradiated by the primary beam, as a secondary beam to cause imaging of the secondary beam; and detecting an image caused by said imaging of the secondary beam and outputting a signal to form a one-dimensional or two-dimensional image of a surface of the substrate.

According to a fifth aspect of the present invention, there is provided a method of manufacturing a semiconductor device comprising a substrate inspection method, said substrate inspection method including:

emitting an electron beam and causing the electron beam to irradiate a substrate to be inspected as a primary beam;

projecting at least one of a secondary electron, a reflected electron and a backscattered electron that are generated from the substrate that has been irradiated by the electron beam, as a secondary beam to cause imaging of the secondary beam;

detecting an image caused by said imaging of the secondary beam and outputting a signal to form a one-dimensional or two-dimensional image of a surface of the substrate; and generating an electromagnetic wave and causes the electromagnetic wave to irradiate a location on the surface of the substrate at which the secondary beam is generated.

According to a sixth aspect of the present invention, there is provided a method of manufacturing a semiconductor device comprising a substrate inspection method, said substrate inspection method including:

emitting an electron beam and causing the electron beam to irradiate a substrate to be inspected that has an insulator formed thereon as a primary beam under a condition such that the insulator is negatively charged;

projecting at least one of a secondary electron, a reflected electron and a backscattered electron that are generated from the substrate that has been irradiated by the primary beam, as a secondary beam to cause imaging of the secondary beam; and detecting an image caused by said imaging of the secondary beam and outputting a signal to form a one-dimensional or two-dimensional image of a surface of the substrate.

According to a seventh aspect of the present invention, there is provided a substrate inspection apparatus comprising:

an electron beam irradiation device which emits an electron beam and causes the electron beam to irradiate a substrate to be inspected as a primary beam;

an electron beam detector which exclusively detects a reflected electron among electrons generated from the substrate that has been irradiated by the primary beam, said reflected electron having an energy immediately after generation thereof substantially equivalent to an incident energy of the primary beam; and a mapping projection optical system which projects said reflected electron exclusively as a secondary beam and causes imaging of the secondary beam on said electron beam detector to an inspection image of one or two dimension.

According to an eighth aspect of the present invention, there is provided a substrate inspection apparatus comprising:

an electron beam irradiation device which emits an electron beam and causes the electron beam to irradiate a substrate to be inspected as a primary beam;

an electron beam detector which detects a reflected electron among electrons generated from the substrate that has been irradiated by the primary beam, said reflected electron having an energy immediately after generation thereof substantially equivalent to an incident energy of the primary beam;

a mapping projection optical system which projects said reflected electron as a secondary beam and causes imaging of the secondary beam on said electron beam detector as an inspection image of one or two dimension; and a controller which controls at least one of said electron beam irradiation device, said mapping projection optical system and said electron beam detector on the basis of at least one of a first, a second and a third estimated values, said first estimated value being representative of an extent of distortion of the inspection image, said second estimated value being representative of a S/N of a signal outputted from said electron beam detector, and said third estimated value being representative of an extent of difference in contrast among materials in the inspection image when an area of the substrate to be inspected is constituted of a plurality of different materials.

According to a ninth aspect of the present invention, there is provided a substrate inspection method comprising:

emitting an electron beam and causing the electron beam to irradiate a substrate to be inspected as a primary beam;

projecting exclusively a reflected electron among electrons generated from the substrate that has been irradiated by the primary beam, as a secondary beam to cause imaging of the secondary beam to an inspection image of one or two dimension, said reflected electron having an energy immediately after generation thereof substantially equivalent to an incident energy of the primary beam; and detecting said reflected electron at said imaging of the secondary beam to output a signal to form the inspection image of one or two dimension.

According to a tenth aspect of the present invention, there is provided a substrate inspection method comprising:

emitting an electron beam and causing the electron beam to irradiate a substrate to be inspected as a primary beam;

projecting a reflected electron among electrons generated from the substrate that has been irradiated by the primary beam, as a secondary beam to cause imaging of the secondary beam to an inspection image of one or two dimension, said reflected electron having an energy immediately after generation thereof substantially equivalent to an incident energy of the primary beam;

detecting said reflected electron at said imaging of the secondary beam to output a signal to form the inspection image of one or two dimension; and controlling at least one of the irradiation of the primary beam, a trajectory of the secondary beam and the detection of the electrons on the basis of at least one of a first, a second and a third estimated values, said first estimated value being representative of an extent of distortion of the inspection image, said second estimated value being representative of a S/N of the signal to form the inspection image, and said third estimated value being representative of an extent of difference in contrast among materials in the inspection image when an area of the substrate to be inspected is constituted of a plurality of different materials.

According to an eleventh aspect of the present invention, there is provided a method of manufacturing a semiconductor device comprising a substrate inspection method, said substrate inspection method including:

emitting an electron beam and causing the electron beam to irradiate a substrate to be inspected as a primary beam;

projecting exclusively a reflected electron among electrons generated from the substrate that has been irradiated by the primary beam, as a secondary beam to cause imaging of the secondary beam to an inspection image of one or two dimension, said reflected electron having an energy immediately after generation thereof substantially equivalent to an incident energy of the primary beam; and detecting said reflected electron at said imaging of the secondary beam to output a signal to form the inspection image of one or two dimension.

According to a twelfth aspect of the present invention, there is provided a method of manufacturing a semiconductor device comprising a substrate inspection method, said substrate inspection method including:

emitting an electron beam and causing the electron beam to irradiate a substrate to be inspected as a primary beam;

projecting a reflected electron among electrons generated from the substrate that has been irradiated by the primary beam, as a secondary beam to cause imaging of the secondary beam to an inspection image of one or two dimension, said reflected electron having an energy immediately after generation thereof substantially equivalent to an incident energy of the primary beam;

detecting said reflected electron at said imaging of the secondary beam to output a signal to form the inspection image of one or two dimension; and controlling at least one of the irradiation of the primary beam, a trajectory of the secondary beam and the detection of the electrons on the basis of at least one of a first, a second and a third estimated values, said first estimated value being representative of an extent of distortion of the inspection image, said second estimated value being representative of a S/N of the signal to form the inspection image, and said third estimated value being representative of an extent of difference in contrast among materials in the inspection image when an area of the substrate to be inspected is constituted of a plurality of different materials.

BRIEF DESCRIPTION OF THE DRAWINGS

FIG. 13 is a table of combinations of electron beam irradiation conditions in the substrate inspection apparatus of FIG. 9;

DETAILED DESCRIPTION OF THE INVENTION

Embodiments of the present invention are described below with reference to the accompanying drawings.

First Embodiment

Figure 1:
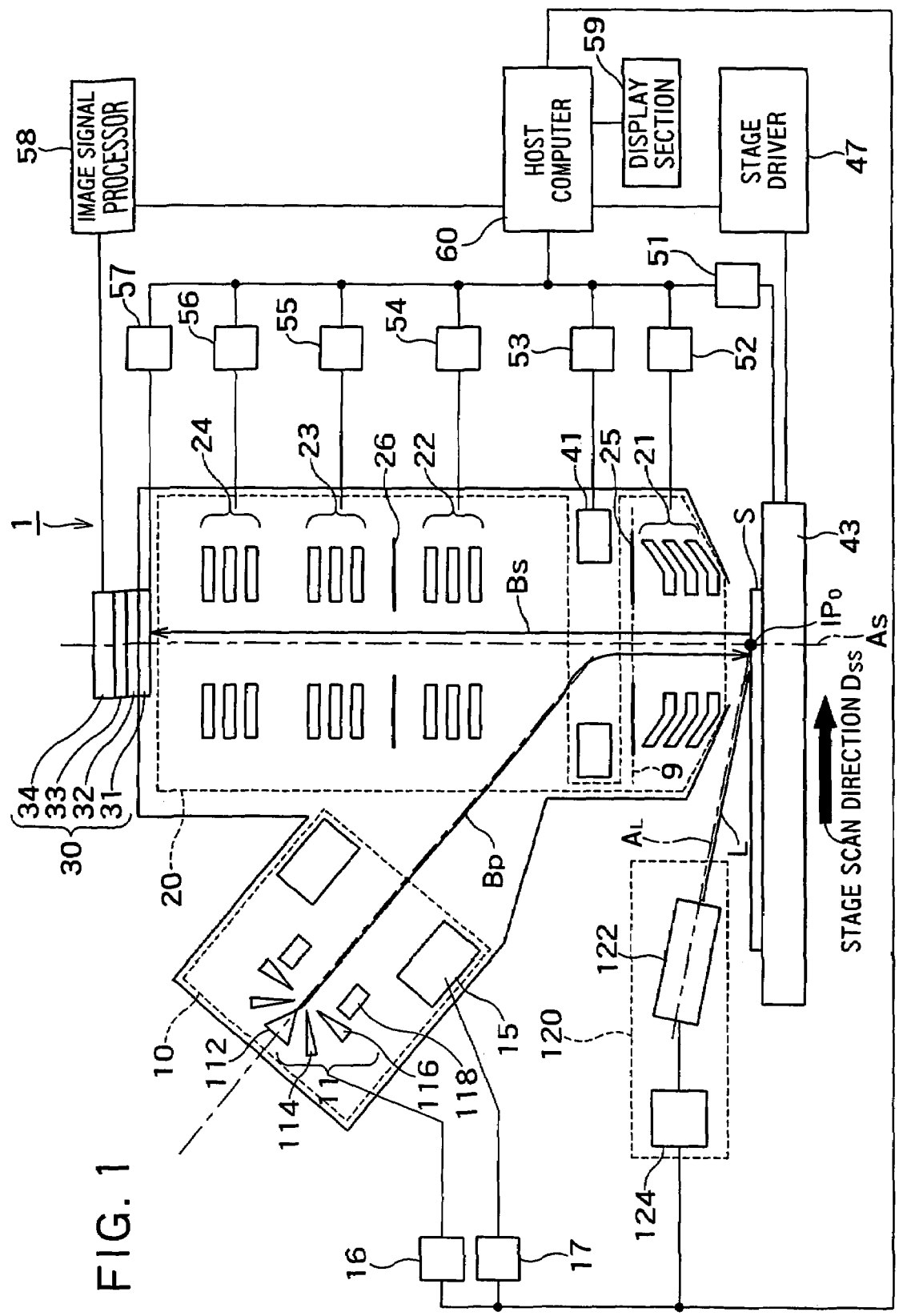
FIG. 1 is a block diagram of a substrate inspection apparatus in accordance with a first embodiment of the present invention.

A block diagram of the basic configuration of a substrate inspection apparatus in accordance with a first embodiment of the present invention is shown in FIG. 1. A substrate inspection apparatus 1 shown in this figure comprises a primary optical system 10, a Wien filter 41, a secondary optical system 20, an electron detector 30, an image signal processor 58, a host computer 60, a display section 59, a stage 43, a stage driver 47, and various controllers 16, 17, and 51 to 57, together with a laser beam irradiation device 122 that is specific to this embodiment.

The primary optical system 10 includes an electron gun section 11 and a plurality of stages of quadrupole lenses 15. The electron gun section 11 has an $LaB_6$ linear cathode 112 having a rectangular electron emission surface of 100 μm to 700 μm along the long axis and 15 μm along the short axis, a Wehnelt electrode 114, an anode 116 for electron beam extraction, and a deflector 118 for adjusting the optical axis. The acceleration voltage, radiation current and the optical axis of a primary beam Bp are controlled by an electron gun controller 16. The electron gun controller 16 is connected to the host computer 60 and receives control signals supplied there from. A plurality of stages of quadrupole lenses 15 is controlled by a multi-stage quadrupole lens controller 17 to focus the primary beam Bp emitted from the linear cathode 112 and control the trajectory thereof so that it is incident from an angle on the Wien filter 41. The multi-stage quadrupole lens controller 17 is also connected to the host computer 60 and receives control signals supplied there from.

The Wien filter 41 receives control signals from the host computer 60 through a Wien filter controller 53, and deflects the primary beam Bp entering from the primary optical system 10 to make it incident substantially perpendicular to the surface of a the specimen S. The primary beam Bp that has passed through the Wien filter 41 is subjected to the lens action of a cathode lens 21 that is a rotationally symmetrical electrostatic lens so that it irradiates the surface of the specimen S perpendicularly.

The specimen S is disposed on the stage 43, with the configuration being such that a negative voltage can be applied thereto by a stage voltage controller 51 through this stage 43. The objective of this mechanism is to reduce incident damage to the specimen S by the primary beam Bp and increase the energy of a secondary beam Bs formed of secondary electrons, reflected electrons, and backscattered electrons that are generated by variations in the shape, properties, or potential of the surface of the specimen by the irradiation of the primary beam Bp. The stage 43 receives control signals supplied from the stage driver 47 and moves in a direction $D_{SS}$ (indicated by an arrow in FIG. 1 for this embodiment) so that the surface of the specimen S is scanned with the primary beam Bp.

Figure 2:
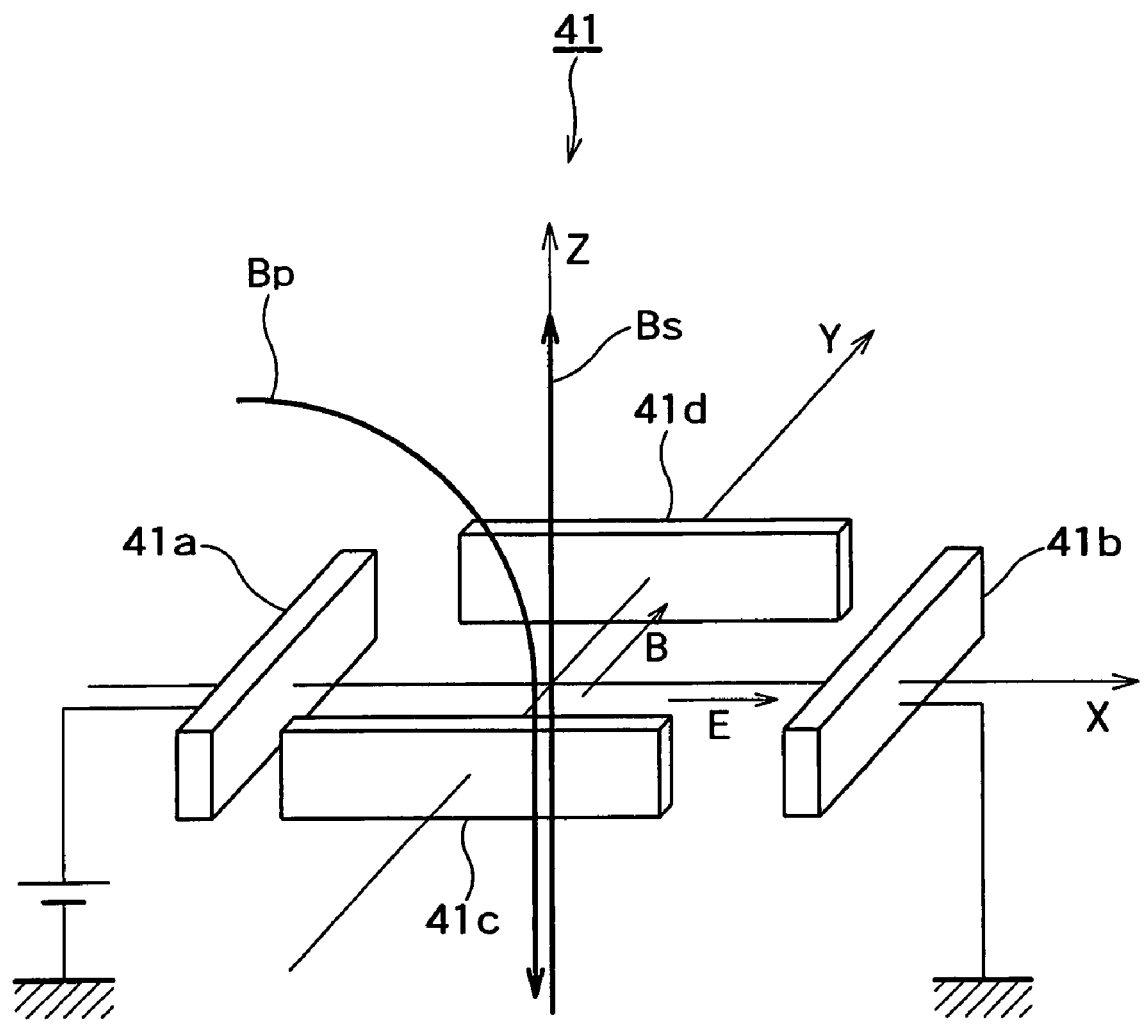
FIG. 2 is a perspective view of a specific configuration of the Wien filter comprised by the substrate inspection apparatus of FIG. 1.
Figure 3:
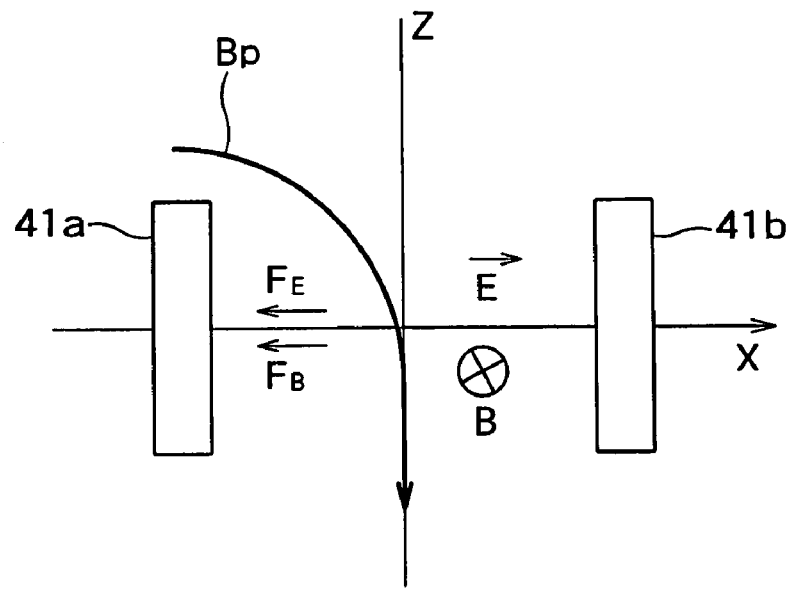
FIGS. 3 and 4 are illustrative of the operating principle of the Wien filter of FIG. 2.
Figure 4:
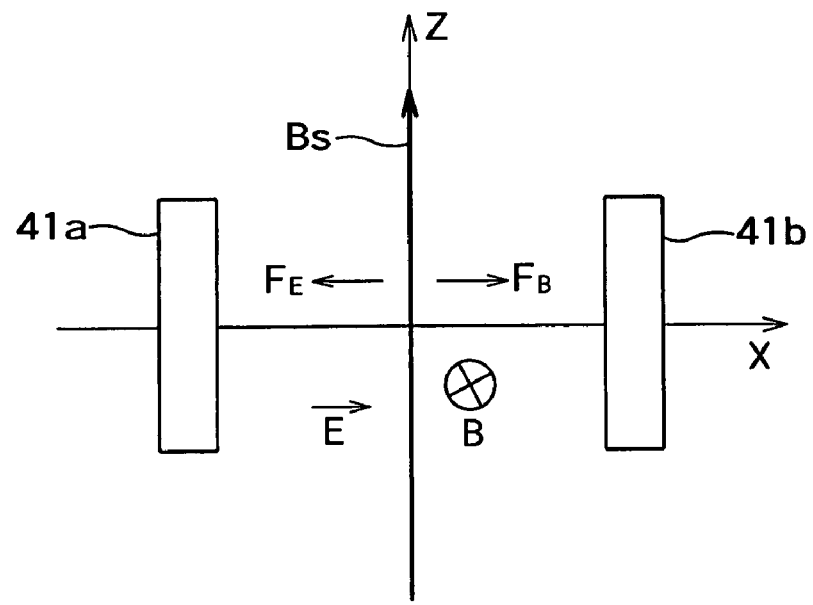

A specific configuration of the Wien filter 41 is shown in FIG. 2 and the operating principle thereof is illustrated in FIGS. 3 and 4. As shown in FIG. 2, the electromagnetic field of the Wien filter 41 has a configuration in which an electrical field E and a magnetic field B are perpendicular to each other within a plane that is orthogonal to the optical axis (Z axis) of a secondary optical system, so that only those electrons of an incident electron beam Bp that satisfy the Wien condition $qE=vB$ (where q is the charge of an electron and v is the velocity of a moving electron) are allowed to proceed. As shown in FIG. 3, in the substrate inspection apparatus 1, a force $F_B$ by the magnetic field and a force $F_E$ by the electrical field act on the primary beam Bp in the same direction, causing the primary beam Bp to deflect so that it is incident perpendicularly to the specimen S. On the other hand, regarding the secondary beam Bs, the forces $F_B$ and $F_E$ act on in opposite directions, and also the Wien condition $F_B=F_E$ is satisfied, therefore, the secondary beam Bs is not deflected and so proceeds onward and enters the secondary optical system 20.

Returning to FIG. 1, the secondary optical system 20 includes the cathode lens 21 which is a rotationally symmetrical electrostatic lens, a second lens 22, a third lens 23, a fourth lens 24, a numerical aperture 25 which is disposed within a horizontal plane 9 that is perpendicular to the optical axis As of the secondary optical system between the Wien filter 41 and the cathode lens 21, and a field aperture 26 which is installed between the second lens 22 and the third lens 23. The cathode lens 21, the second lens 22, the third lens 23, and the fourth lens 24 are controlled by a cathode lens controller 52, a second lens controller 54, a third lens controller 55, and a fourth lens controller 56, respectively, to perform projection imaging of the secondary beam Bs. The cathode lens 52, the second lens controller 54, the third lens controller 55, and the fourth lens controller 56 each receive various control signals that are supplied from the host computer 60 connected thereto. With the apparatus configuration shown in FIG. 1, the numerical aperture 25 is disposed at a position in the horizontal plane 9 that suppresses amplified color aberrations of the secondary beam Bs, and this ensures that the cathode lens 21 and the second lens 22 combine to perform a single image of the secondary beam Bs. Since this configuration also means that the irradiation region of the primary beam Bp on the specimen S is limited by the numerical aperture 25, a Koeller illumination system is used to control the trajectory of the primary beam Bp in the space between the numerical aperture 25 and the specimen S in such a manner that the primary beam Bp focuses on the numerical aperture iris 25 which, in addition to the following lens action of the cathode lens 21, makes it irradiate the specimen S substantially perpendicularly.

The electron detector 30 includes a micro-channel plate (MCP) detector 31, a fluorescent plate 32, a light guide 33, and a capture element 34 such as a charge-coupled device (CCD). The secondary beam Bs that is incident on the MCP detector 31 is amplified by the MCP and irradiates the fluorescent plate 32. The capture element 34 detects a fluorescent image generated by the fluorescent plate 32, through the light guide 33, and sends a detection signal to the image signal processor 58. The image signal processor 58 processes the detection signal and supplies it to the host computer 60 as image data representing an image of one or two dimension. The host computer 60 processes the thus-supplied image data, displays the image on the display section 59. It also saves the image data and uses various image processing techniques to detect whether or not there are defects in the specimen S and, if defects are detected, outputs an evaluation of their severity.

A laser beam irradiation device 120 is installed in the vicinity of the secondary optical system 20, to reduce the local potential difference of the surface of the specimen S by generating a laser beam for shining on the specimen S. The laser beam irradiation device 120 corresponds to, for example, an electromagnetic radiation device, and includes a laser beam source 122 that generates a laser beam L, and a power source 124 that supplies electrical power to the laser beam source 122. The axis AL of the laser beam is set to join at an intersection $IP_0$ of the surface of the specimen S and of the optical axis As of the secondary optical system, and this ensures that the laser beam L emitted by the laser beam source 122 irradiates the center of the inspection region of the surface of the specimen that is irradiated by the primary beam Bp. Adjustment of the laser beam axis AL is done by disposing a sensor for detecting a laser parameter or the like of the laser beam at the position of the intersection $IP_0$, and monitoring the output therefrom while adjusting the laser beam source to obtain the largest value of the output.

When the primary beam Bp is shone onto the surface of the specimen S during the inspection, local differences will occur in the magnitude of charge on the surface of the specimen S, depending on the shape and properties of the surface of the specimen S or the layers in the vicinity of that surface. In particular, if there is an insulator in the surface of the specimen S, the charge magnitude will increase and there will also be many places in which those charges (electrons and holes) cannot migrate (be neutralized).

In such a case, according to this embodiment the laser beam L from the laser beam source 122 enables resident charges or peripheral charges to absorb the energy of the laser beam L, putting them into a state that facilitates migration, and, as a result, makes it possible to reduce local charges at charged locations on the specimen surface (even if the charge magnitude of the insulator as a whole does not change) reducing local potential differences.

Specific methods of reducing such local potential differences include:

1) A method of irradiating the entire insulator charge location with electromagnetic waves having energy that enables conduction;
2) A method of irradiating with electromagnetic waves imparted with energy that enables the migration of electrons and holes that have been immobilized at the local level of the insulator; and
3) A method of reducing charge in the vicinity of boundaries between different materials on the specimen surface.

These methods are described below within the second and third embodiments of the present invention.

Second Embodiment

Figure 5:
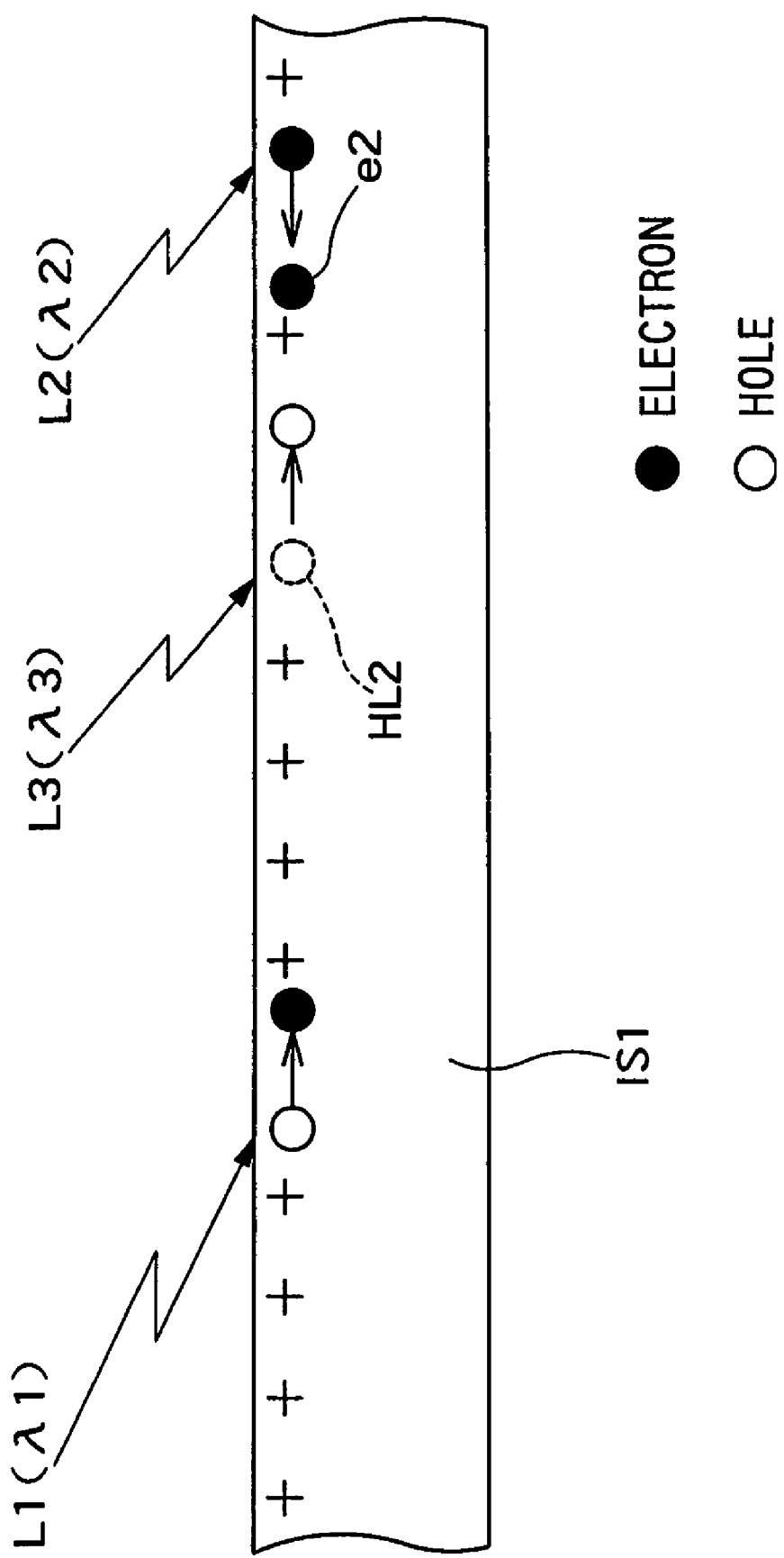
FIG. 5 is a schematic view illustrating a substrate inspection method in accordance with a second embodiment of the present invention.

The description turns to a substrate inspection method in accordance with a second embodiment of the present invention, with reference to FIG. 5. The surface of an insulator IS1 shown on the left-hand side of the figure is charged locally by a positive charge. On the surface of the insulator IS1 on the right-hand side of the figure, there are electrons and holes that have been immobilized at the local level. Note that this local charging and the immobilization of electrons and holes at the local level are not limited to insulating regions; it can also occur in semiconductor regions.

Figure 6:
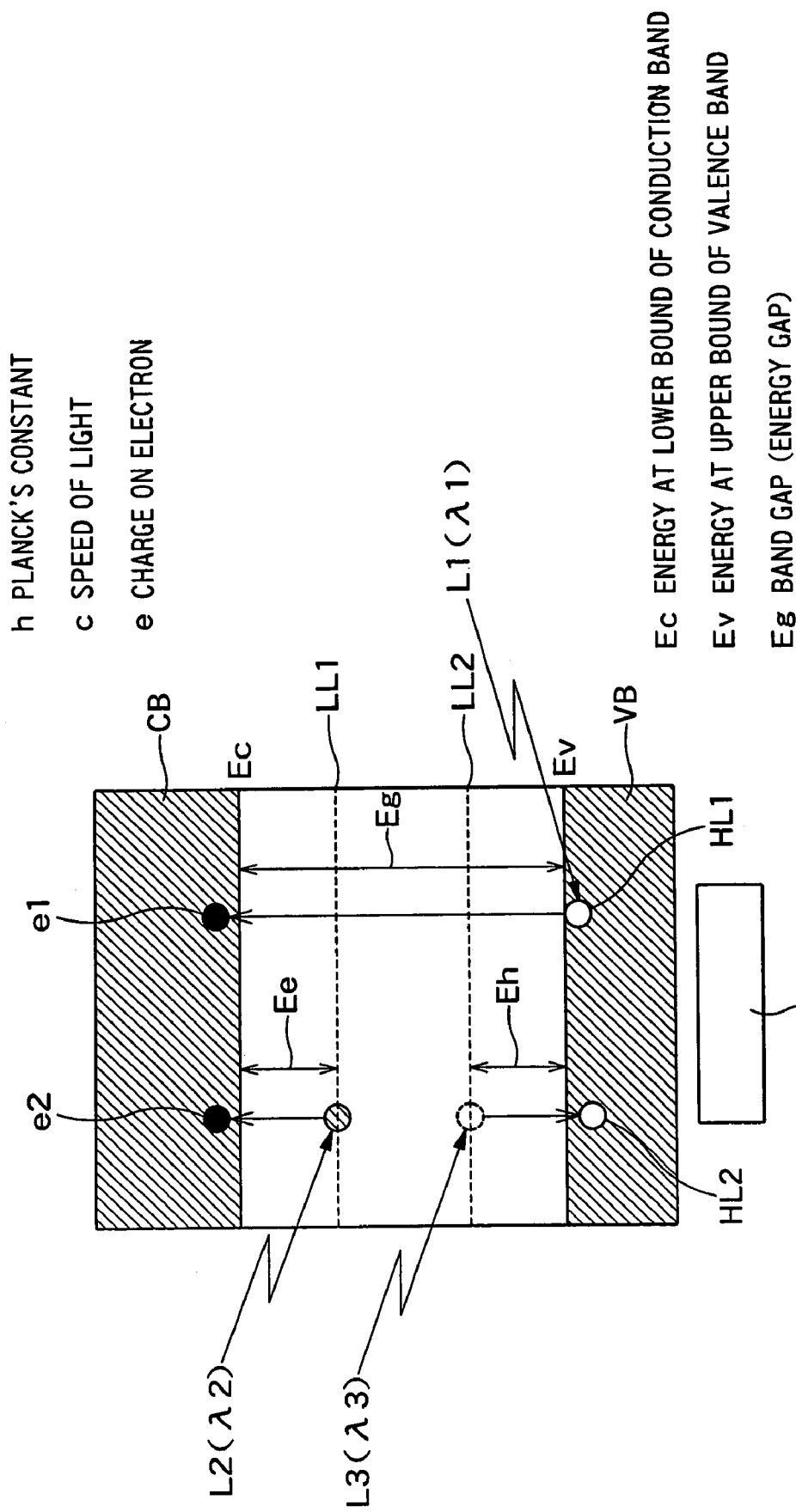
FIG. 6 is illustrative of energy bands of the insulator of FIG. 5.

An energy band diagram of the insulator IS1 is shown in FIG. 6. To enable the migration of local charges in the insulator IS1, a laser beam (electromagnetic waves) L1 having energy of at least the same magnitude as the band gap Eg of the insulator could be shone thereon, to cause the generation of electron-hole pairs as shown on the left-hand side of FIG. 5 and thus put the insulator IS1 itself into a conductive state. The wavelength $\lambda 1$ of the laser beam L1 that is necessary for achieving such a state has to satisfy the equation $\lambda 1 < hc/Eg$, where h is Planck's constant and c is the speed of light. If the above-described insulator IS1 is silicon dioxide ($SiO_2$) and that energy gap Eg is 9 (eV), for example, the longest wavelength $\lambda m$ of the laser beam L1 having energy of at least that energy gap is given by:

$$\lambda m = hc/Eg = 137 \text{ (nm)}$$

As shown in the right-hand portion of FIG. 5, there are local levels LL1 and LL2 in the insulator IS1 that immobilize electrons and holes (see the left-hand portion of FIG. 6), and electrons e2 and holes HL2 that are immobilized by these have a large effect on the charged state of the insulator IS1. The electrons e2 and holes HL2 that have been immobilized by these local levels LL1 and LL2 can be made to migrate by causing them to absorb energy from laser beams L2 and L3 that are shone thereon as shown in FIG. 5. This makes it possible to reduce local charges that cause immobilization to the local potential, thus making it possible to reduce local potential differences. More specifically, the immobilized electrons e2 can be made to migrate if they are irradiated with a laser beam (electromagnetic waves) L2 having at least the energy difference Ee between the local level LL1 at which the electrons e2 are immobilized and the lower bound of the conduction band Ec, as shown in FIG. 6. The wavelength $\lambda 2$ of the laser beam L2 that is necessary for achieving such a state must satisfy the condition: $\lambda 2 < hc/Ee$. Similarly, the immobilized holes HL2 can be made to migrate if they are irradiated with a laser beam (electromagnetic waves) L3 having at least the upper bound of the valence band Ev. The wavelength $\lambda 3$ of the laser beam L3 that is necessary for achieving such a state must satisfy the condition: $\lambda 3 < hc/Eb$. As the wavelength of a laser beam shortens, both the size and cost of the apparatus increase. However, since $\lambda 1 < \lambda 2$ and $\lambda 1 < \lambda 3$ are effective in general, it is possible to constrain the cost and size of the laser beam irradiation device 120 by reducing the local charge of the insulating body IS1 through above-mentioned migration of the immobilized electrons e2 and holes HL2 as long as there are no problems with the capability of the apparatus. This makes it possible to implement an apparatus that is much more cost-effective and compact.

Third Embodiment

Figure 7:
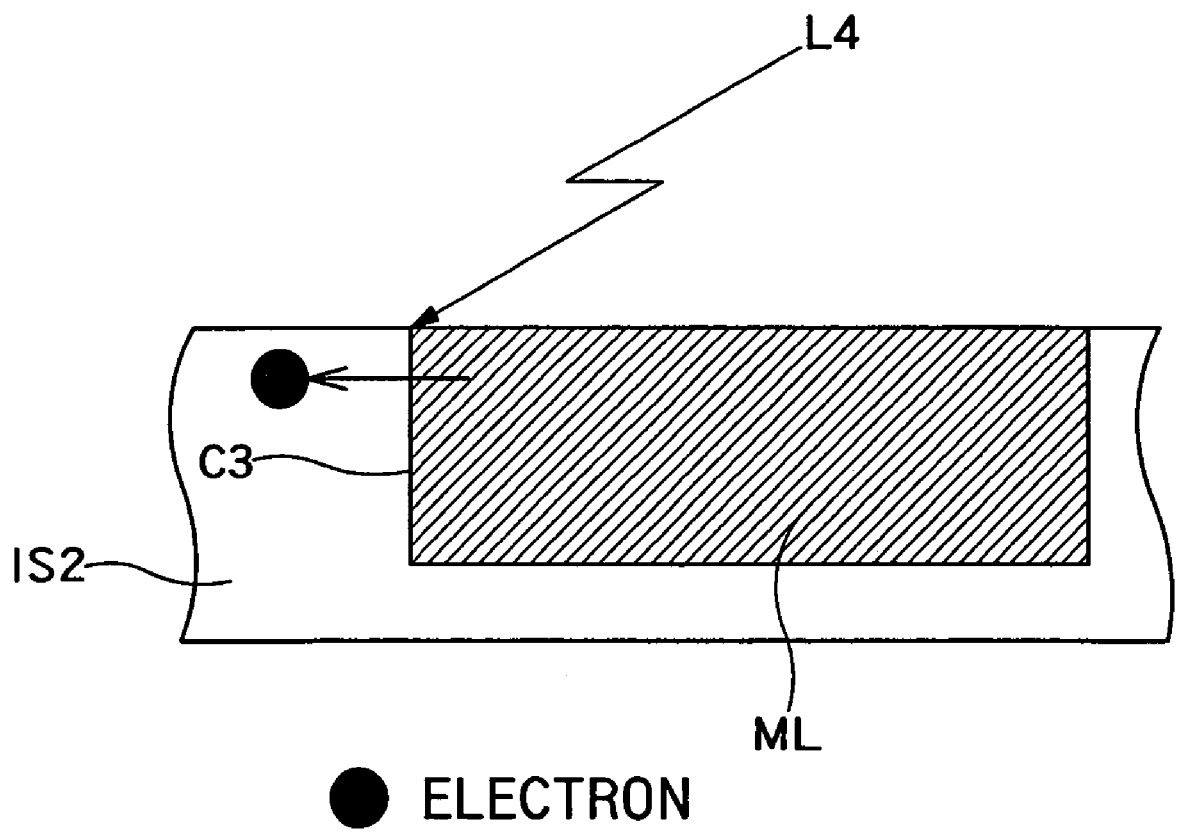
FIG. 7 is a schematic view illustrating a substrate inspection method in accordance with a third embodiment of the present invention.

The method of this embodiment reduces the charge of the insulator in the vicinity of each boundary between an insulator and a conductor or in the vicinity of an insulator and a semiconductor. Simply using the inspection method of this third embodiment reduces local potential differences in the vicinities of the above-described boundaries, thus making it possible to suppress distortion and contrast deterioration of the detected image of the secondary beam, with no need of making the charge location of the insulator conductive. If the insulator is positively charged, for example, electrons could migrate (be implanted) from the metal or semiconductor to the insulator, to neutralize that positive charge. In an example shown in FIG. 7, the irradiation of a laser beam L4 onto a boundary C3 between a metal layer ML and an insulator IS2 causes electrons to migrate from the metal layer ML to the insulator IS2.

Figure 8:
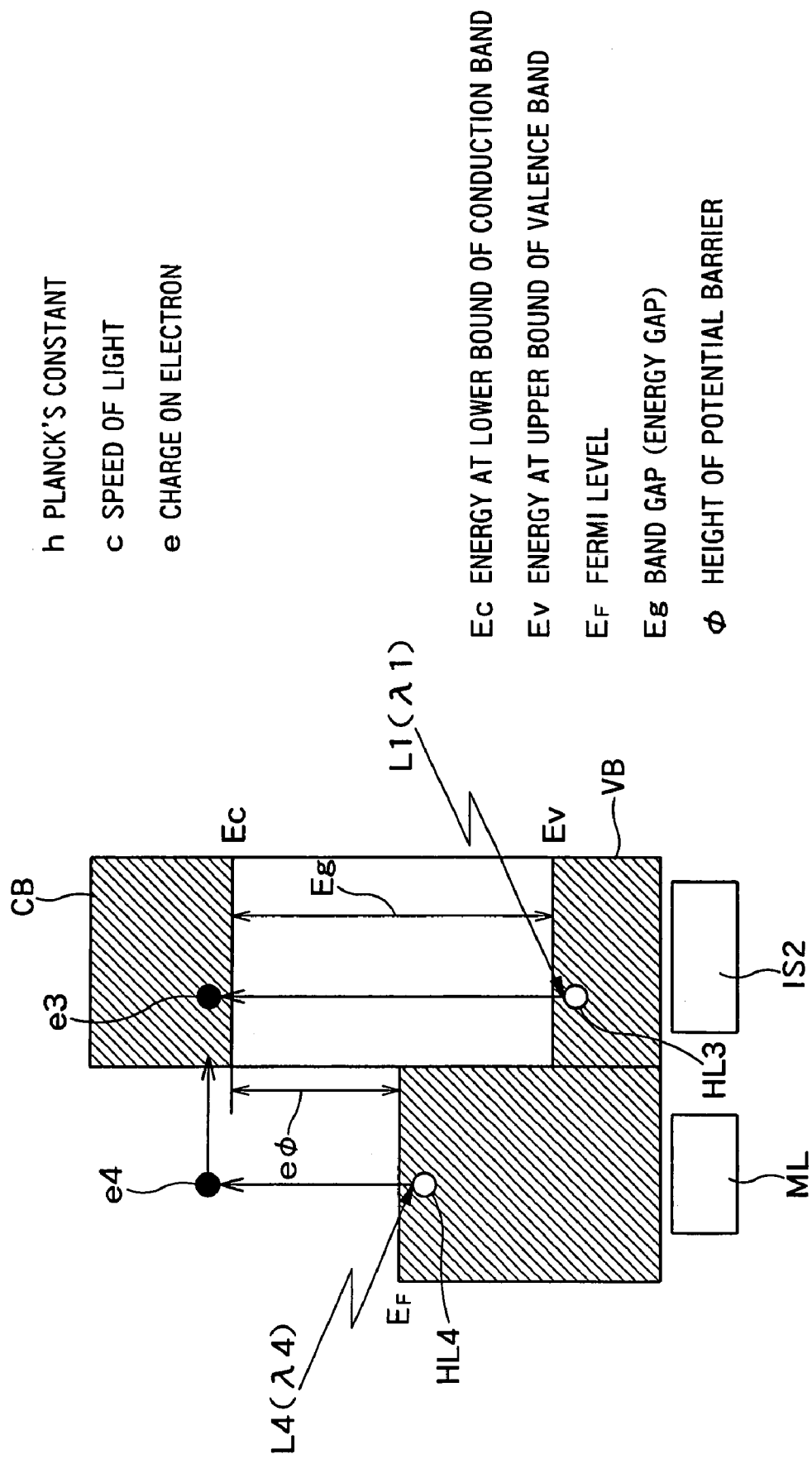
FIG. 8 is illustrative of energy bands in the junction between the metal and the insulator of FIG. 7.

The energy bands at the connection between the metal and the insulator are shown in FIG. 8. A laser beam (electromagnetic waves) L4 having an energy of at least the energy $e\phi$ of the contact potential barrier of the boundary between the metal layer ML and the insulator IS2 could be shone onto this boundary C3 to cause an electron e4 within the metal layer ML to migrate to the insulator IS2. The wavelength $\lambda 4$ of the laser beam L4 that is necessary for achieving such a state must satisfy the condition: $\lambda 4 < hc/Eb$. In this case, if the conductor is silicon (Si), the insulator is silicon dioxide ($SiO_2$), and the potential barrier at the Si—$SiO_2$ contact region is Eb=3.5 (eV), the longest wavelength $\lambda m$ of the laser beam L4 having energy of at least that potential barrier is given by:

$\lambda m = hc/Eg = 354$ (nm)

In general, since $\lambda 1 < \lambda 4$, it is possible to constrain the cost and size of the laser beam irradiation device 120 by neutralizing the positive charges of the insulating body IS2 in the vicinity of the above-described boundaries, provided there are no problems with the capability of the apparatus. This makes it possible to provide an apparatus that is much more cost-effective and compact.

Note that the laser beam irradiation device 120 is used in this embodiment for reducing local potential differences in the surface of the specimen S, but any other device for irradiating electromagnetic waves could be used therefore, such as a device that uses X-rays or an ultraviolet lamp in accordance with factors such as the properties or shape of the specimen to be inspected.

Fourth Embodiment

Figure 9:
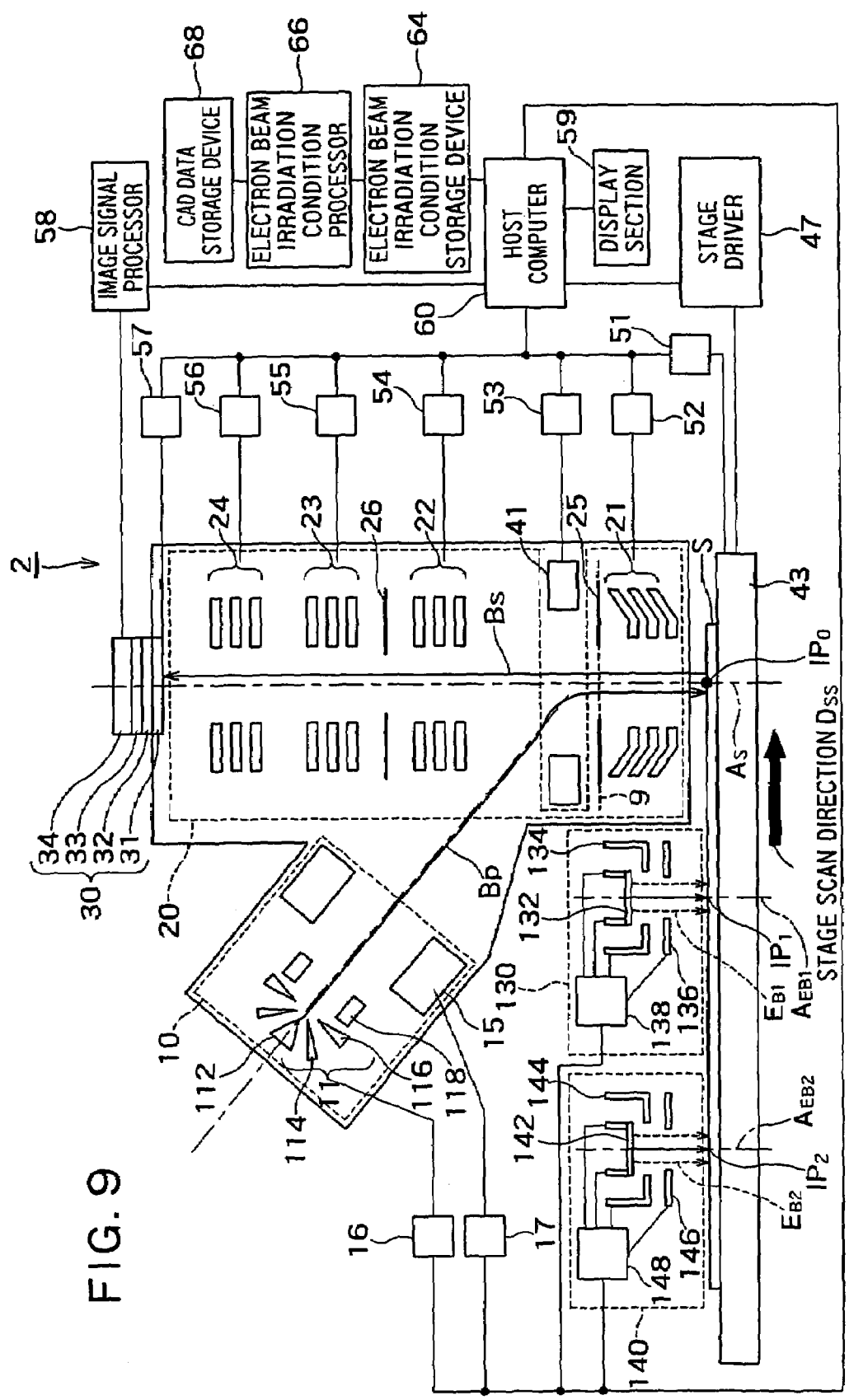
FIG. 9 is a block diagram of a substrate inspection apparatus in accordance with the third embodiment of the present invention.

A block diagram of the basic configuration of a substrate inspection apparatus in accordance with a fourth embodiment of the present invention is shown in FIG. 9. A substrate inspection apparatus 2 shown in this figure is characterized in that it comprises additional electron beam irradiation devices 130 and 140 to generate the electron beams $E_{B1}$ and $E_{B2}$, respectively, for irradiating the specimen S, a CAD data storage device 68, an electron beam irradiation condition processor 66, and an electron beam irradiation condition storage device 64. The rest of the configuration of the substrate inspection apparatus 2 is substantially the same as that of the substrate inspection apparatus 1 of FIG. 1.

The electron beam irradiation device 130 is disposed at a position such that an arbitrary point within the exposure region of the specimen S first passes through an intersection $IP_1$ between the optical axis $A_{EB1}$ of the electron beam from the electron beam irradiation device 130 itself and the surface of the specimen S, before the intersection $IP_0$ between the optical axis As of the secondary optical system and the surface of the specimen S, with respect to the stage scan direction $D_{SS}$ during the inspection of the specimen surface. Similarly, the electron beam irradiation device 140 is disposed at a position such that an arbitrary point within the exposure region of the specimen S first passes through an intersection $IP_2$ between the optical axis $A_{EB2}$ of the electron beam irradiation device 140 itself and the surface of the specimen S, before the above-described intersection $IP_1$. Such a disposition makes it possible to reduce potential differences in the specimen surface by the electron beam irradiation devices 130 and 140 before the secondary electronic image of the specimen surface is obtained by the electron detector 30. The description of this embodiment below takes as an example in which the specimen surface moves in sequence through the intersection $IP_2$, the intersection $IP_1$, and the intersection $IP_0$.

The electron beam irradiation device 130 includes a W filament 132, a Wehnelt electrode 134, an anode 136 and an electron beam controller 138. The W filament 132 has a coil shape and generates the electron beam $E_{B1}$. The W filament 132 is disposed so as to shine the electron beam $E_{B1}$ of this embodiment perpendicularly onto the surface of the specimen S. The Wehnelt electrode 134 controls the rate of emission of the electron beam EB1 from the W filament 132. The anode 136 extracts the electron beam EB1 emitted from the W filament 132. The W filament 132, the Wehnelt electrode 134, and the anode 136 are all connected to an electron beam controller 138 and are controlled thereby.

Similarly, the electron beam irradiation device 140 includes a W filament 142 for generating the electron beam EB2, a Wehnelt electrode 144, an anode 146 and an electron beam controller 148, with these structural elements being disposed in a similar manner and exhibiting similar functions as the W filament 132, the Wehnelt electrode 134, and the anode 136 of the electron beam irradiation device 130. Further description of those structural elements is therefore omitted.

The CAD data storage device 68 stores data on layout patterns of the specimen S of the object to be inspected and data on the electrical characteristics of each layout pattern. The electron beam irradiation condition processor 66 uses the data stored in the CAD data storage device 68 to pre-calculate irradiation conditions for the primary beam Bp and the electron beams $E_{B1}$ and $E_{B2}$ in advance of the inspection. The electron beam irradiation condition storage device 64 stores the results of the calculations of the electron beam irradiation condition processor 66.

The description now turns to the principles of the substrate inspection method of this embodiment.

One way of solving the problems of distortion and contrast deterioration in the detected secondary beam image is to reduce the potential gradients in the specimen surface that are the cause thereof. As described with reference to the example of FIG. 28, the primary beam Bp could irradiate the surface of the specimen S with the insulating portion 214 under negative charging conditions, to reduce the potential difference between the metal wiring 212 and the insulating portion 214. A contact potential is always formed in the contact region between a metal and an insulator, so that the insulator is in a positive potential state of several volts with respect to the metal, when the primary beam Bp is not shone thereon. In such a case, the primary beam Bp could be shone onto the insulator under a condition in which the insulator is negatively charged.

Figure 10:
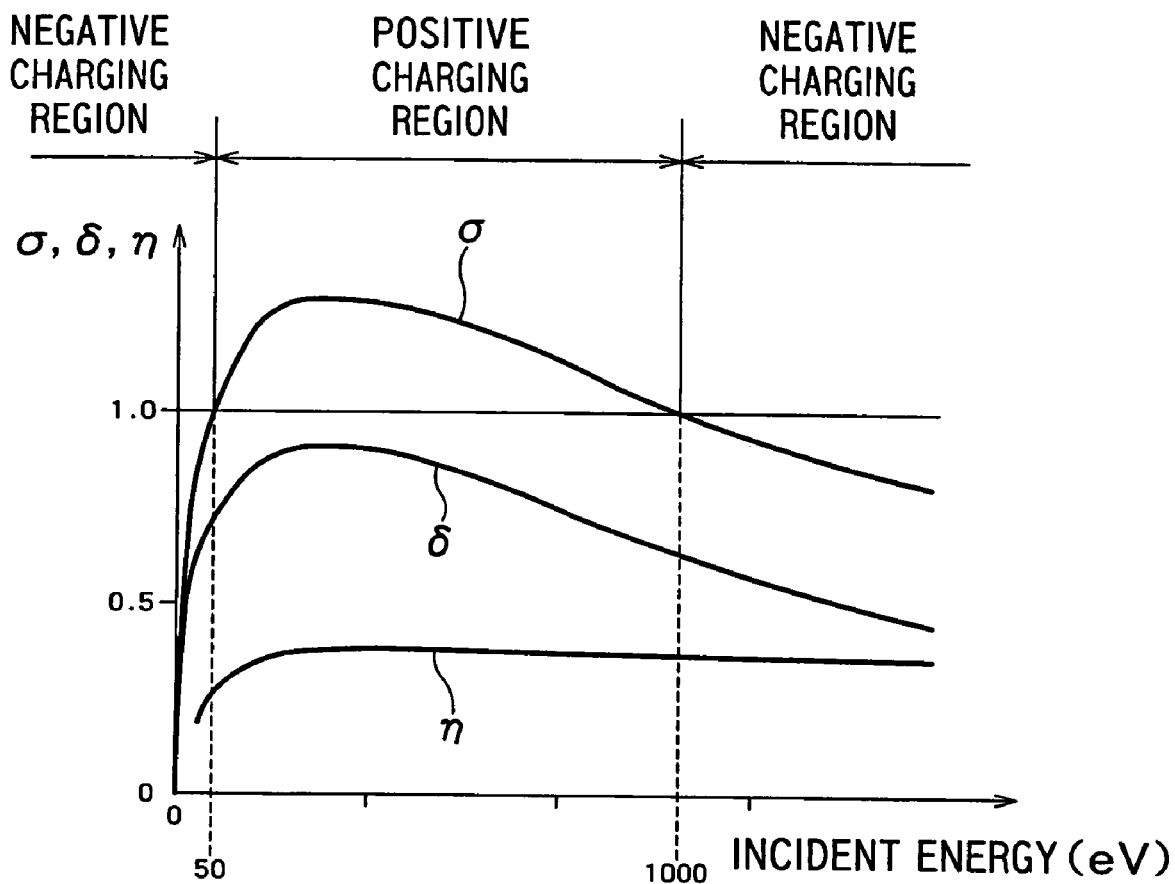
FIG. 10 is a graph of an example of the relationship between incident energy of an electron beam on $SiO_2$ and the total secondary electron emission ratio.
Figure 28:
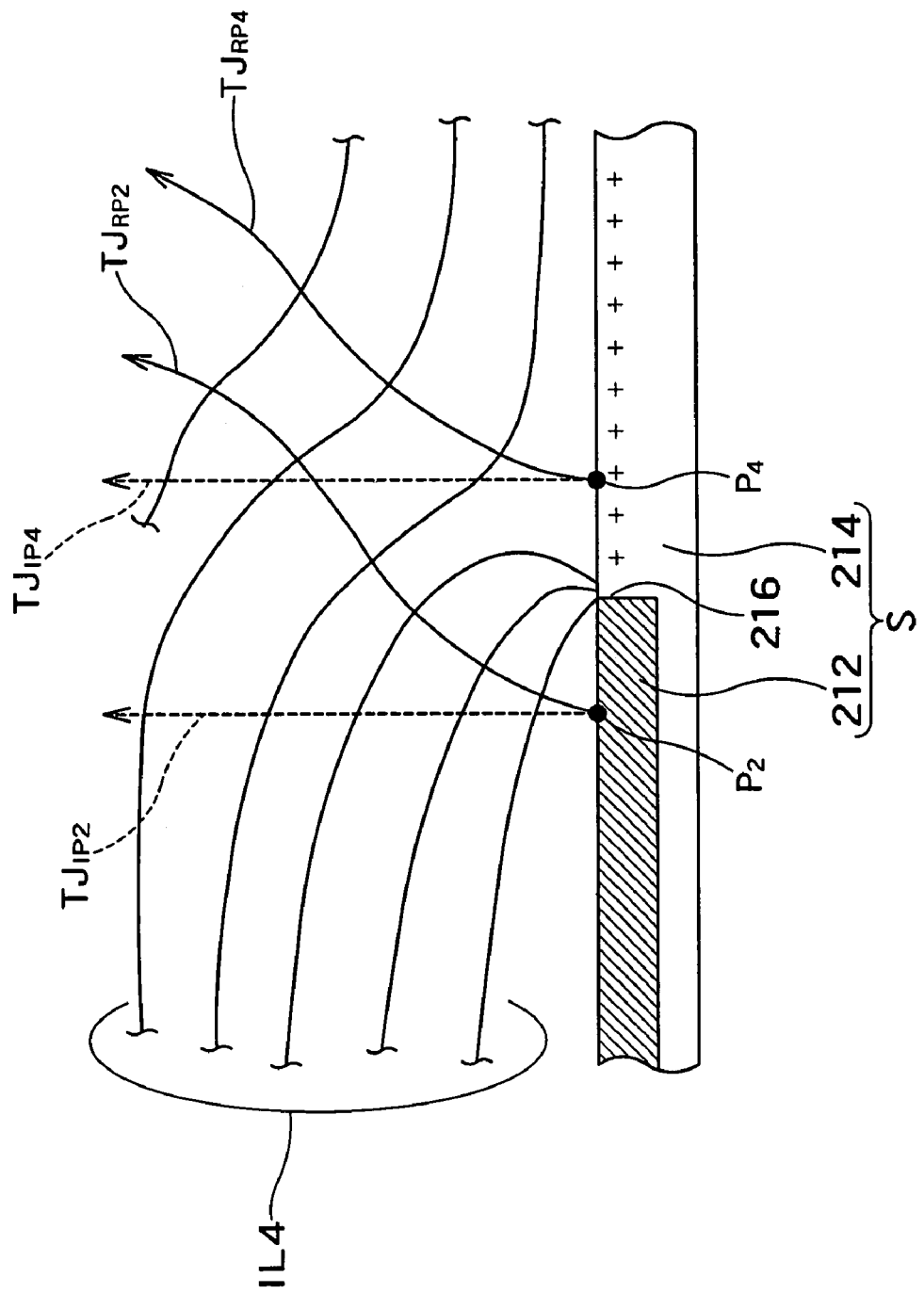
FIG. 28 illustrates another problem with the substrate inspection method in accordance with a conventional technique.

The condition in which the insulator is negatively charged could be one in which a primary beam irradiates the insulator with incident energy such that the total secondary electron emission ratio σ from the insulator is 1 or less, in which case, if the insulator 214 shown in FIG. 28 is $SiO_2$, the value of the incident energy is at least approximately 1 keV or no more than approximately 50 eV, as shown in FIG. 10. If the quantity of secondary electrons (in this case, secondary electrons are used in a broad sense so as to include reflected electrons and backscattered electrons) is increased, the signal level for forming the image will increase, which will shorten the time until an image is formed. In other words, this makes it possible to shorten the inspection time. Conventional methods have been used in which this total secondary electron emission ratio δ is set to at least 1, from consideration of inspection throughput. With this embodiment of the invention, however, the insulating portions are negatively charged by setting the total secondary electron emission ratio δ to less than 1, in contradiction to conventional technique. This makes it possible to increase the accuracy of the detected image. Hereinafter, this process of irradiating the insulator with the electron beam under negative charging conditions is called Process 1.

Figure 11:
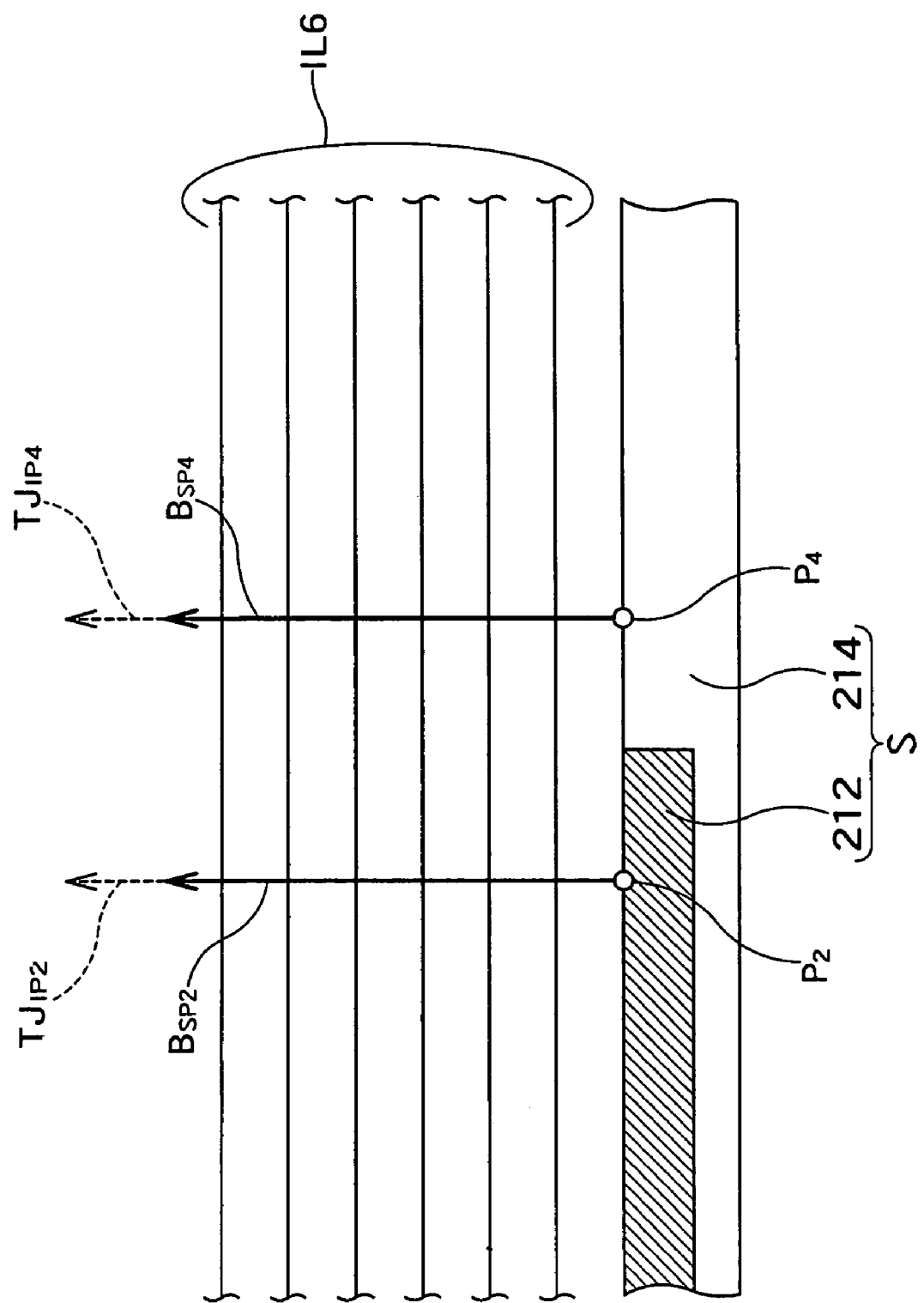
FIG. 11 is illustrative of the effects obtained by the substrate inspection method of a fourth embodiment of the present invention.

Taking the specimen S shown in FIG. 28 as an example, the above-described Process 1 gradually reduces the potential of the insulating portion 214 from an initial state at which it is at a few positive volts with respect to the metal wiring 212, until it is at the same potential as the metal wiring 212, as shown in FIG. 11. The secondary beam trajectory Bsp2 and Bsp4 in this state are the same as the electron beam trajectories $TJ_{IP2}$ and $TJ_{IP4}$ that are ideal for accurate mapping projection. As a result, it is possible to obtain an inspection image with no distortion or contrast deterioration.

However, executing this process of reducing the potential differences of the surface of the specimen S as far as possible before the process of obtaining the inspection image takes time to even out the potential differences of the specimen surface, causing the inspection throughput to deteriorate. In this case, as will be described later, the use of a separate electron beam from the primary beam Bp that is used for observation makes it possible to solve the problem of throughput deterioration, with substantially no wait time, by using the separate electron beam to pre-irradiate the inspection region of the surface of the specimen S, in parallel with the irradiation by the primary beam Bp and immediately before the irradiation by the primary beam Bp, to reduce potential differences in that region to as small as possible. With this embodiment, the additional electron beam irradiation devices 130 and 140 are used to perform pre-processing by the electron beams $E_{B1}$ and $E_{B2}$. This pre-processing is called Process 2 below.

There is a problem with Process 1 and Process 2, concerning a difference in the dosage of the electron beams necessary for minimizing surface potential differences, which is created by the layout pattern and electrical characteristic of the metal wiring 212 and the insulating portion 214 in the surface of the specimen S. If the metal wiring 212 takes up a large proportion of the area, a large quantity of electrons will leak from the insulating portion 214 to the metal wiring 212, making it necessary to irradiate a large quantity of the electron beams until the surface potential differences are minimized. In addition, differences are generated in the quantities of electrons leaking from the insulating portion 214, depending on whether or not the metal wiring 212 and the substrate are conductive to each other. Such problems cause image distortion and focus shift due to non-uniformity of the surface potentials within the same field of view during the capture of the surface of the specimen S. One way to avoid such problems would be to adjust a specific irradiation condition that applies when the insulating portion 214 is under a negative charging condition, in accordance with the above-described layout pattern and electrical characteristics, such as the total current magnitude for the electron beam per unit surface area of the specimen S or the energy incident thereon. Since there is a large leakage of electrons from the insulating portion 214 in regions with a large conductive to the substrate, it would be good to increase the total current magnitude for the electron beam per unit surface area of the specimen S to more than in other regions, or irradiate the electron beam with incident energy such that the total secondary electron emission ratio σ is smaller.

It would also be effective to make the surface potentials of the specimen more even before Process 1, even if the electron beam is shone thereon under conditions such that the insulator is positively charged. Such pre-processing is called Process 3 hereinafter.

Figure 12:
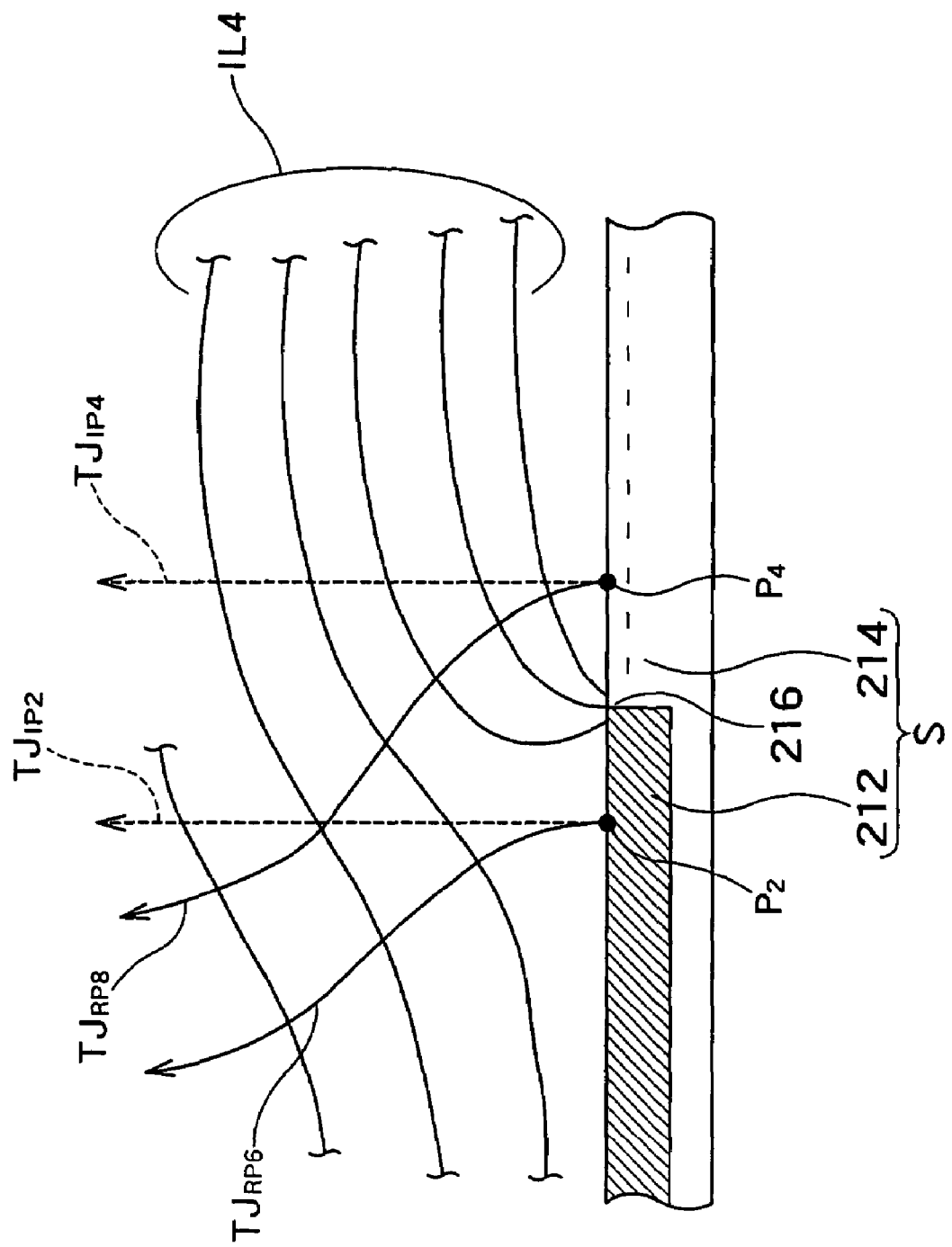
FIG. 12 is illustrative of a problem that occurs if the primary beam irradiates the insulator on the specimen surface too much, under negative charging conditions.

A problem that occurs if the primary beam Bp irradiates the surface of the specimen S too much in the above-described negative charging condition is illustrated in FIG. 12. If the primary beam Bp has irradiated the insulating portion 214 excessively, the insulating portion 214 will become negatively charged and could even acquire a potential that is more negative than the metal wiring 212, as shown in the figure. Other cases could be considered within the same image when the surface of the specimen S is imaged, even when a leveling of surface potentials has been achieved in other regions, such as the insulating portion 214 is in a negatively charged state dependent on the layout pattern and electrical characteristics of the region shown in FIG. 12, or uniform surface potential state has collapsed. In such a case too, local potential gradients that are not parallel to the surface of the specimen S are created in the vicinity of the boundary 216 between the metal wiring 212 and the insulating portion 214, in a similar manner to that shown in FIG. 28 with the positive charge. When the secondary electrons emitted from the point $P_2$ within the metal wiring 212 in the vicinity of the boundary and the point $P_4$ within the insulating portion are controlled by the secondary optical system 20 to form an image on the MCP detector 31, these potential gradients will exert an inappropriate deflection effect, making them deviate from the electron beam trajectories $TJ_{IP2}$ and $TJ_{IP4}$ that are ideal for accurate mapping projection and curve as shown by the trajectories $TJ_{RP6}$ and $TJ_{RP8}$. In such a case, the primary beam Bp pre-irradiates the surface of the specimen S when the insulating portion 214 is under a positive charging condition, before the processing of Process 1, so that regions that are likely to become negatively charged in Process 1 (such as regions in which there is not much of metal wiring 212 or regions in which the metal wiring 212 is conductive with the substrate) will become positively charged before the other regions, during Process 3. Such processing makes it possible to avoid the problem of local variations in surface potential that are dependent on the pattern layout or electrical characteristics of the surface of the specimen S, when an image of the surface of the specimen S is picked up in Process 1.

The substrate inspection apparatus 2 of FIG. 9 operates in accordance with the above inspection principles. The description now turns to specific details of the operation of the substrate inspection apparatus 2.

Before the inspection, the electron beam irradiation condition processor 66 first extracts layout pattern data and electrical characteristic data for the specimen S from the CAD data storage device 68. It calculates the irradiation conditions for the primary beam Bp and the electron beams $E_{B1}$ and $E_{B2}$ at each position of the stage 43 when the location that is the object of observation on the specimen S, in other words, the exposure region is positioned at the intersection $IP_0$ between the optical axis As and the surface of the specimen S, to ensure that either the surface potentials within the exposure region are uniform or any potential differences in the surface are minimized. The results of these calculations are stored in the electron beam irradiation condition storage device 64.

After the inspection has started, the host computer 60 extracts the irradiation conditions for the electron beam EB2, the electron beam EB1, and the primary beam Bp for each stage position, while referencing the current position information of the stage 43 that is supplied from the stage driver 47. In addition, the host computer 60 transmits those irradiation conditions to an electron beam controller 148, the electron beam controller 138, the electron gun controller 16, and the multi-stage quadrupole lens controller 17 to control the electron beam irradiation device 140, the electron beam irradiation device 130, and the primary optical system 10, respectively, and thus adjust the irradiation conditions of the electron beam EB2, the electron beam $E_{B1}$, and the primary beam Bp. The following five cases of these irradiation conditions can be considered, by way of example, as shown in FIG. 13:

Case 1: The primary beam Bp irradiates the insulator under negative charging conditions. The electron beams $E_{B1}$ and $E_{B2}$ are not emitted.

Case 2: The primary beam Bp irradiates the insulator under negative charging conditions. The electron beam $E_{B1}$ irradiates the insulator under negative charging conditions. The electron beam $E_{B2}$ is not emitted.

Case 3: The primary beam Bp irradiates the insulator under negative charging conditions. The electron beam $E_{B1}$ irradiates the insulator under positive charging conditions. The electron beam $E_{B2}$ is not emitted.

Case 4: The primary beam Bp irradiates the insulator under negative charging conditions. The electron beam $E_{B1}$ irradiates the insulator under negative charging conditions. The electron beam $E_{B2}$ irradiates the insulator under positive charging conditions.

Case 5: The primary beam Bp irradiates the insulator under negative charging conditions. The electron beam $E_{B1}$ irradiates the insulator under positive charging conditions. The electron beam $E_{B2}$ irradiates the insulator under negative charging conditions.

In this manner, it is possible to obtain a highly accurate inspection image, with no image distortion or focus shift, by inspecting the specimen S under the optimal conditions for leveling the specimen surface potentials that are adopted by the electron beam irradiation condition processor 66.

Figure 14:
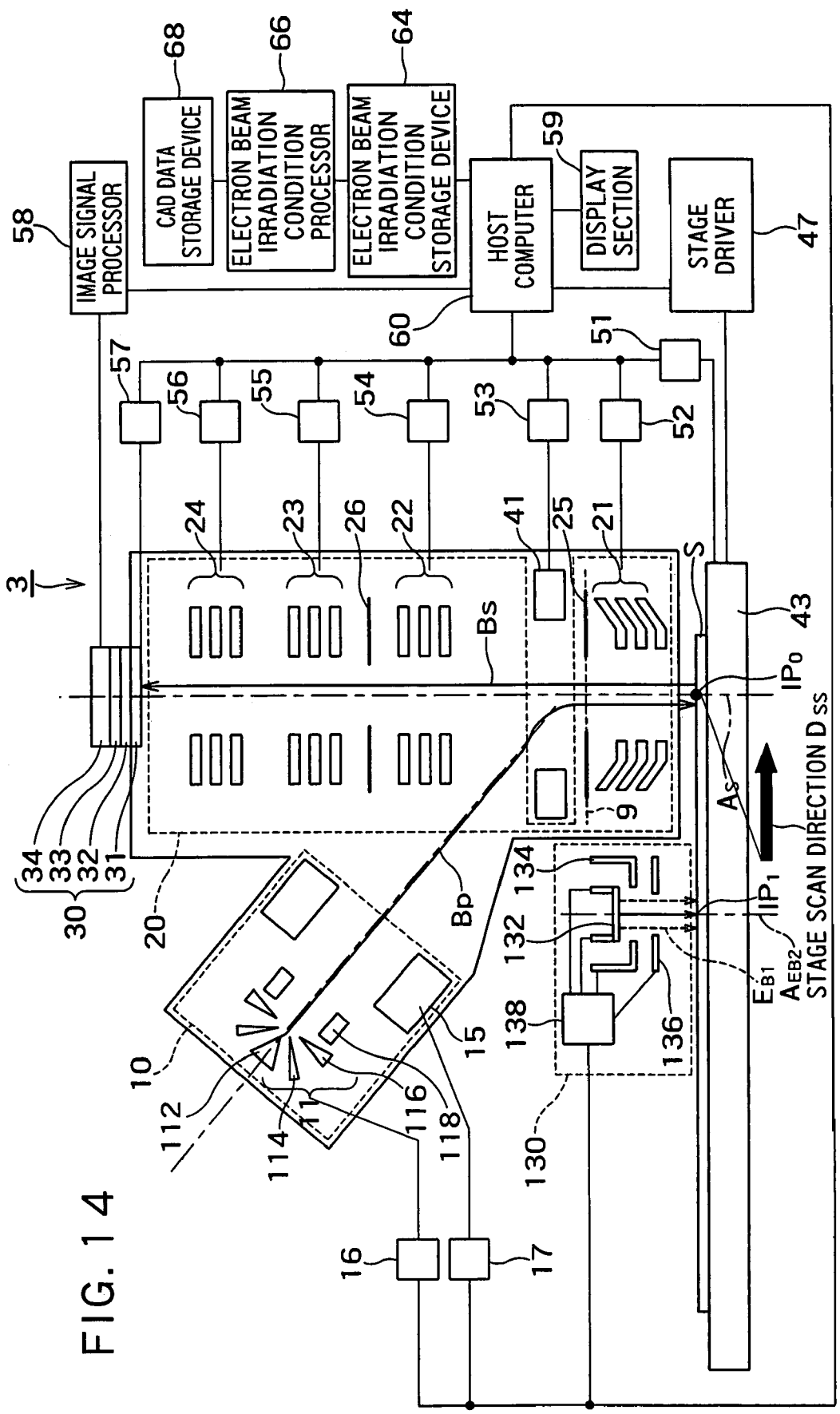
FIG. 14 is a block diagram of a variant example of the substrate inspection apparatus of FIG. 9.

In the description above, two additional electron beam irradiation devices are used for leveling the surface potentials, but the present invention is not limited thereto and thus the above-described method could be employed in a configuration that comprises just one additional electron beam irradiation device, such as in a substrate inspection apparatus 3 shown in FIG. 14 by way of example, or a configuration that comprises three or more additional electron beam irradiation devices (not shown in the figures).

The description now turns to fifth to eighth embodiments of the present invention, with reference to FIGS. 15 to 26. First of all, the inspection principle on which the embodiments below depend will be described with reference to FIGS. 15 and 16. Note that in the following embodiments the term "a secondary electron" is to be used in a narrow sense so as to exclude a reflected electron (and a backscattered electron).

Figure 15:
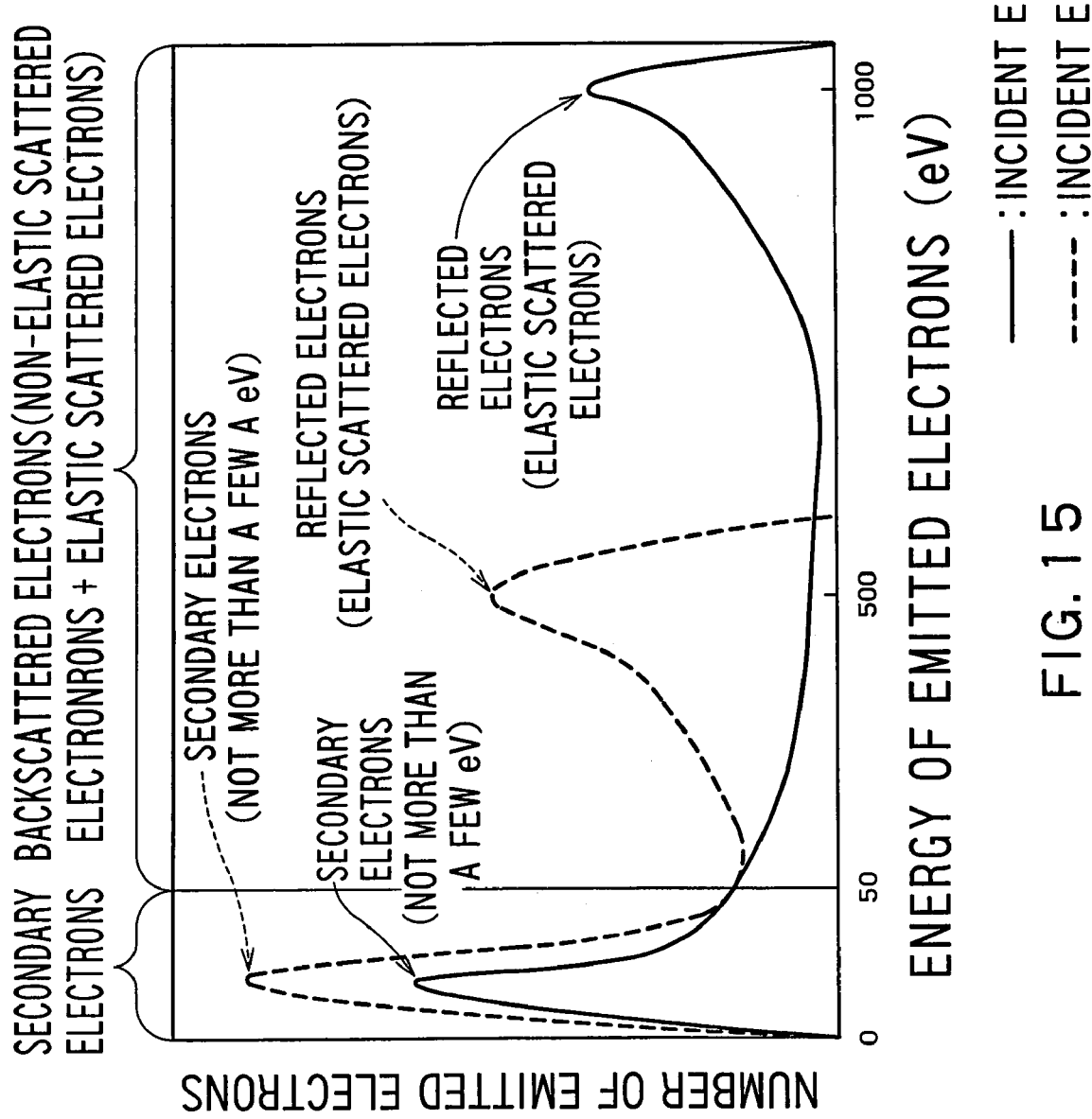
FIG. 15 shows the energy distributions of emitted electrons

To avoid the effects of potential gradients on the specimen surface and implement highly accurate defect detection, it is also possible to use reflected electrons that have higher emission energy than secondary electrons (also called elastic scattering electrons) for the imaging. FIG. 15 shows the energy distributions of electrons emitted from the substrate by incidence of the primary beam thereon. As shown in this graph, the emission energy distribution of the electrons exhibits the largest peak in the region of a few eV or less. With a conventional inspection apparatus, to amplify the magnitude of the detection signal, the secondary optical system is controlled in such a manner that secondary electrons having this emission energy of a few eV or less are imaged on the detection surface of the detector. In contrast thereto, since reflected electrons within the backscattered electrons have substantially the same energy as the incident energy of the primary beam, the use of these reflected electrons in the imaging make it difficult for the above-described potential gradients to have any effect, and ensures the passage of electron beam trajectories that are ideal for accurate mapping projection, such as the trajectories $TJ_{IP2}$ and $TJ_{IP4}$ shown by way of example in FIG. 28. This makes it possible to avoid the problems of distortion and contrast deterioration in the secondary beam inspection image. Note that FIG. 15 shows the energy distribution of emission electrons when the incident energy of the primary beam is 500 eV and when it is 1000 eV, but the present invention is not limited to such high incident energies and can equally well be applied when the incident energy of the primary beam is low, making it possible to avoid distortion and contrast deterioration of the inspection image by the use of imaging of reflected electrons having an emission energy that is higher than that of the secondary electrons.

In addition, even with defect inspection using imaging of these reflected electrons, the optical conditions of the inspection apparatus could be set to ensure that the above-described three characteristics are ideal, to improve the inspection capabilities.

Figure 16:
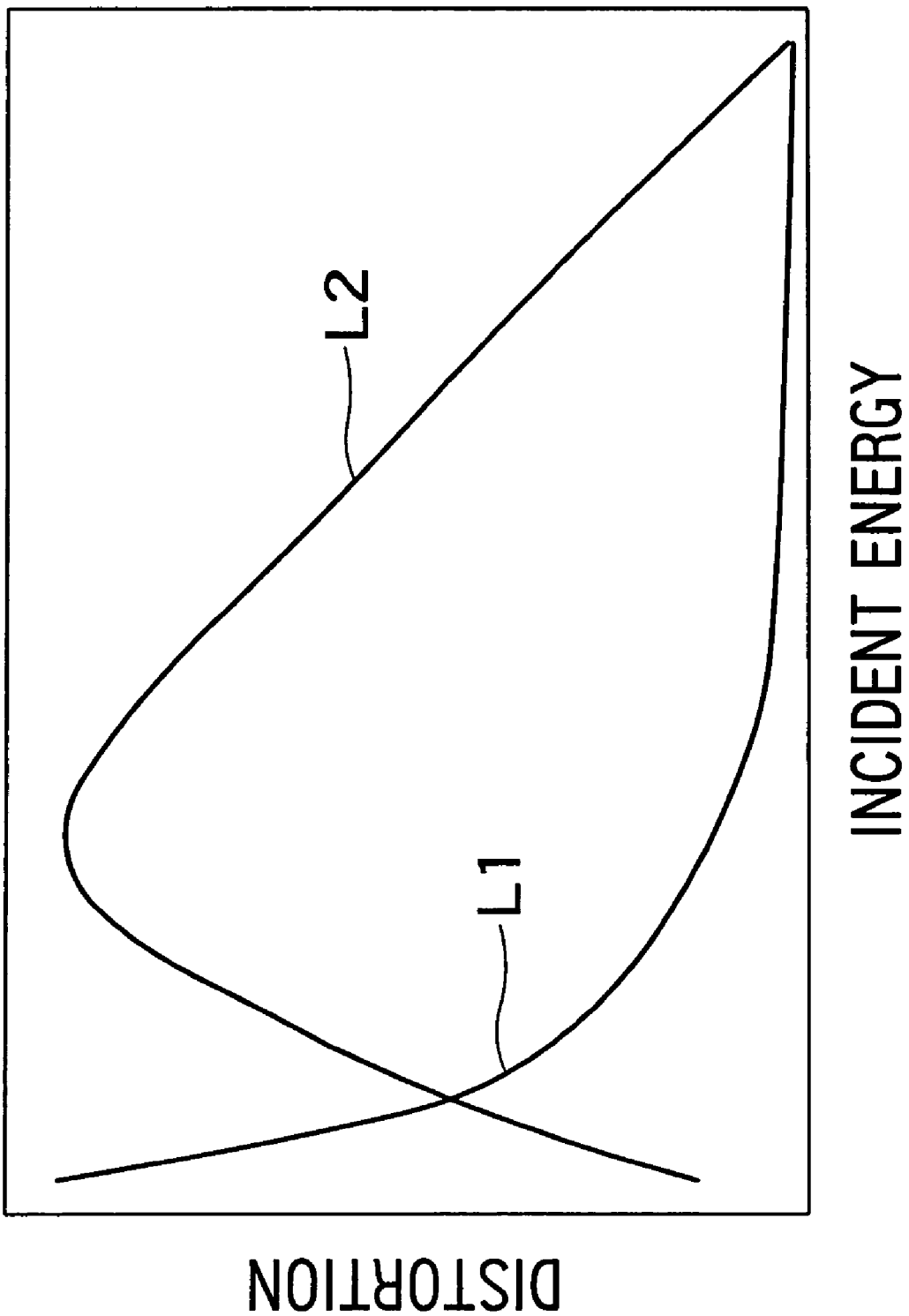
FIG. 16 shows the relationship between the incident energy of the primary beam and the distortion and S/N ratio of the electron image.

However, it is difficult in the prior art to implement conditions that enable optimization of all three of the above characteristics, such as the optimal incident energy of the primary beam. The relationships shown schematically in FIG. 16 are of the primary beam incident energy and the distortion (L1) and S/N (L2) ratio of the detected image during observation of an integrated circuit on the surface of a wafer that has been imaged by using reflected electrons. From the distortion viewpoint, since the emission energy of reflected electrons increases as the incident energy increases, the effects due to local potential differences on the specimen surface become less obvious and so distortion is reduced to a certain degree.

However, from the S/N viewpoint, the incident electrons penetrate into the deeper locations of the specimen in regions in which incident energy is high, so that the quantity of emitted reflected electrons is reduced in such locations and thus the signal magnitude that contributes to the imaging of the specimen surface (corresponding to the S/N ratio) is reduced by that amount. The S/N ratio of the detected image is therefore reduced. Note that the actual quantities of reflected electrons and backscattered electrons that are emitted from the specimen in regions in which the incident energy is low are amplified, but the signal magnitude (the N part of the S/N ratio) of electrons that arrive at the detection surface of the detector but do not contribute to the imaging (electrons having lower energy levels than those of the reflected electrons, on the order of only a few to several hundred eV) is also amplified by an amplification ratio for noise (N) that is greater than the amplification ratio for the signal (S), so the S/N ratio is effectively reduced.

The above reasoning shows that it is substantially impossible with the conventional inspection apparatus to implement incident energy for the primary beam such that distortion is minimized but the S/N ratio is maximized. If the characteristic that renders the material contrast maximized is considered as well, it becomes even more impossible to implement incident energy for the primary beam.

Embodiments of the present invention enable quantitative searching of conditions for obtaining the optimal image, by using estimated values that assess the above-described three characteristics. Some of these embodiments are described below with reference to the accompanying figures.

Fifth Embodiment

Figure 17:
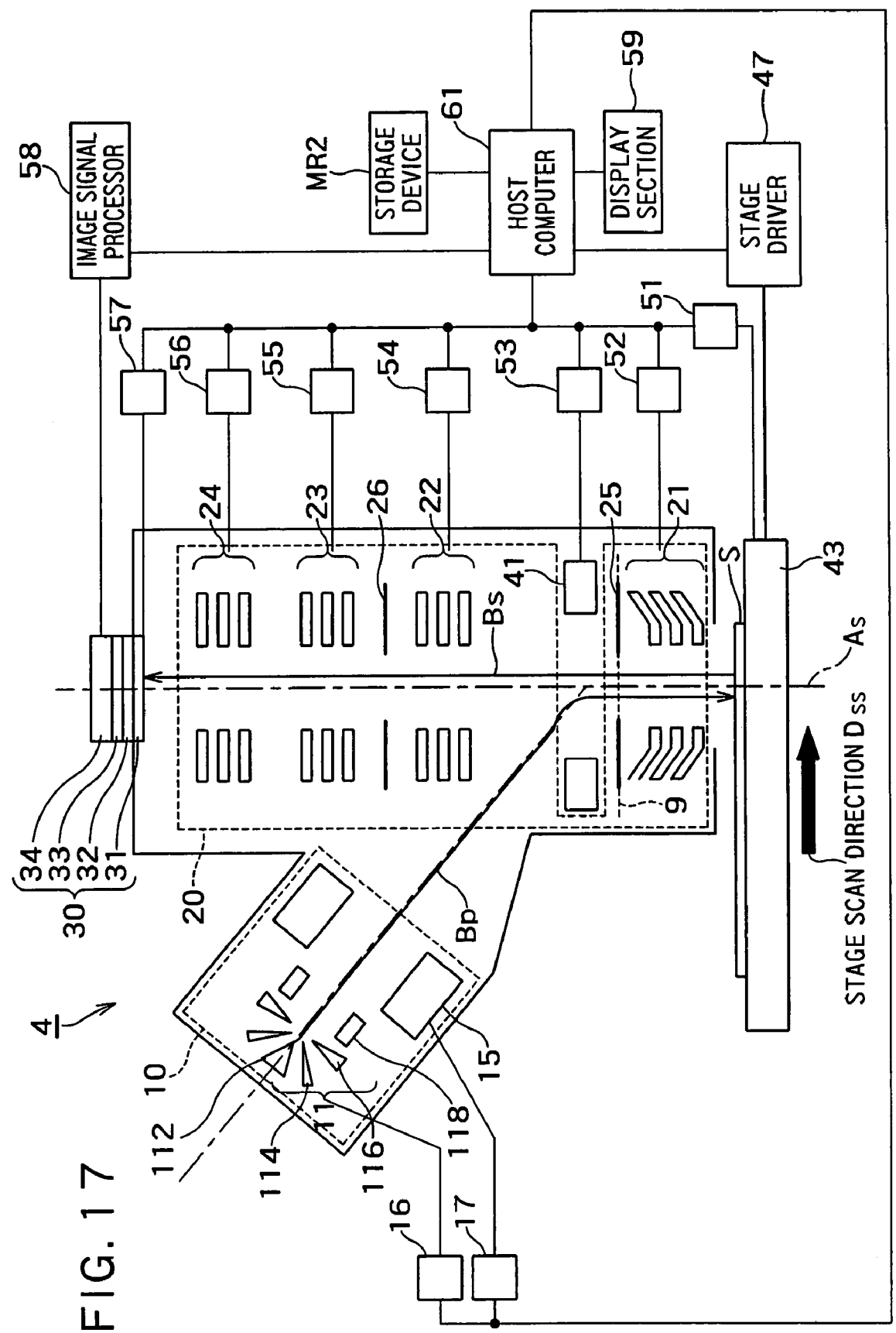
FIG. 17 is a block diagram of the basic configuration of a substrate inspection apparatus in accordance with a fifth embodiment of the present invention.

A block diagram of the basic configuration of a substrate inspection apparatus in accordance with a fifth embodiment of the present invention is shown in FIG. 17. Instead of the host computer 60 of the substrate inspection apparatus 1 shown in FIG. 1 by way of example, a substrate inspection apparatus 4 shown in FIG. 17 comprises a host computer 61 that calculates primary beam incident energy conditions for obtaining the optimal specimen surface images for inspection. The rest of the configuration of the substrate inspection apparatus 4 of this embodiment is substantially the same as the substrate inspection apparatus 1 of FIG. 1, except for the particular provision of a storage device MR2 and the fact that the laser beam irradiation device 120 is not provided.

In addition to storing the image data processed by the host computer 61, the storage device MR2 stores correspondences between the overall image estimated value M(n) and the stage applied voltage Vr, calculated by the host computer 61. The overall image estimated value M(n) and the stage applied voltage Vr will be discussed later.

Figure 18:
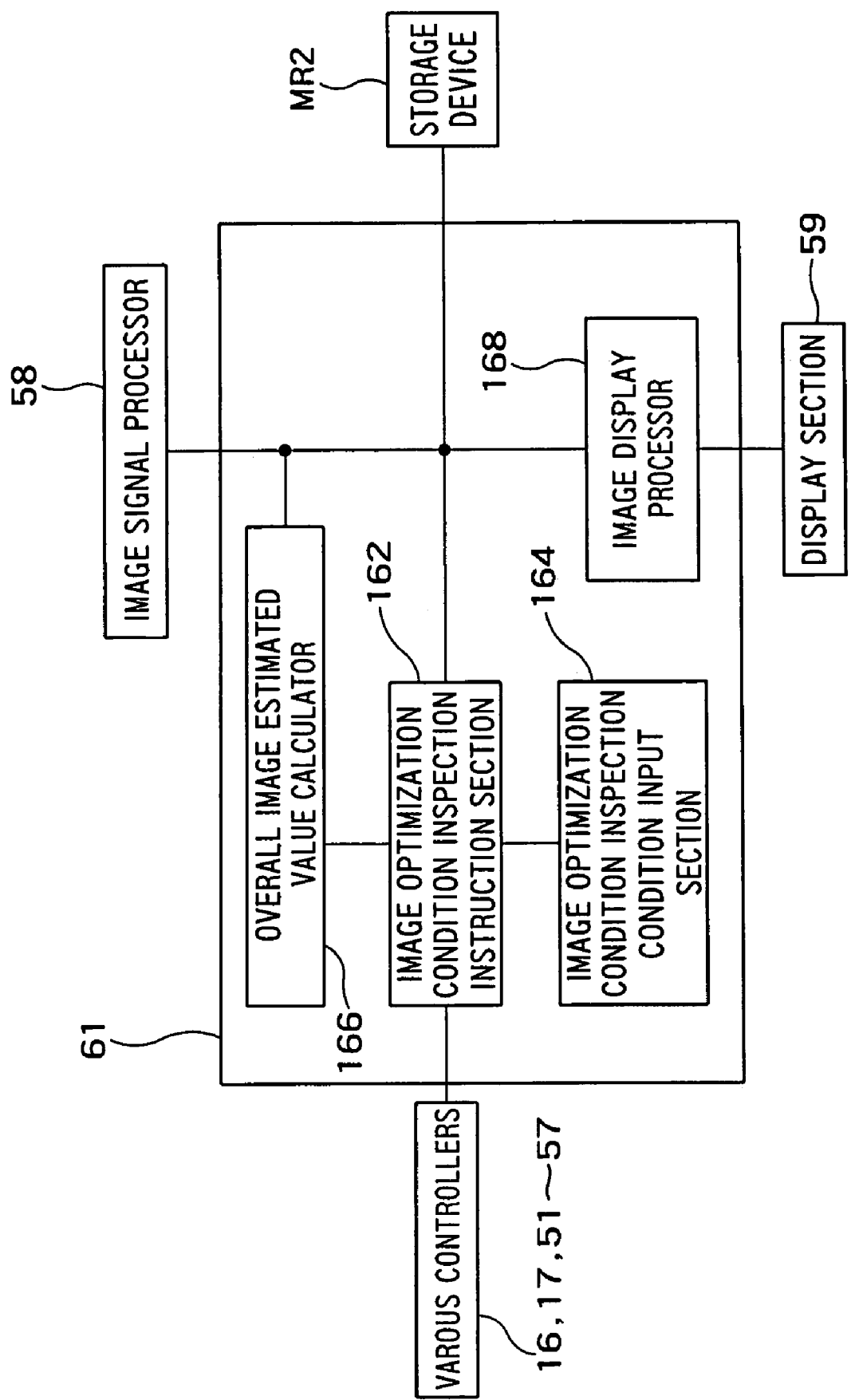
FIG. 18 is a block diagram of a specific configuration of the host computer comprised by the substrate inspection apparatus of FIG. 17.

The description now turns to a more specific configuration of the host computer 61 of the substrate inspection apparatus 4, with reference to the block diagram of FIG. 18. As shown in the figure, the host computer 61 includes an image optimization condition inspection condition input section 164, an image optimization condition inspection instruction section 162, an overall image estimated value calculator 166, and an image display processor 168.

The host computer 61 defines an overall image estimated value M(n) that is a value for evaluating distortion, S/N ratio, and contrast of the detected image in a comprehensive manner, and calculates primary beam incident energy conditions for obtaining the specimen surface image that is best for the inspection, by searching for conditions that maximize this M(n). The operation of the host computer 61 will now be described with reference to the flowchart of FIG. 19. Note that when it comes to inspecting the optimal incident energy conditions with this embodiment, the incident energy will be affected by changes in the stage applied voltage.

Figure 19:
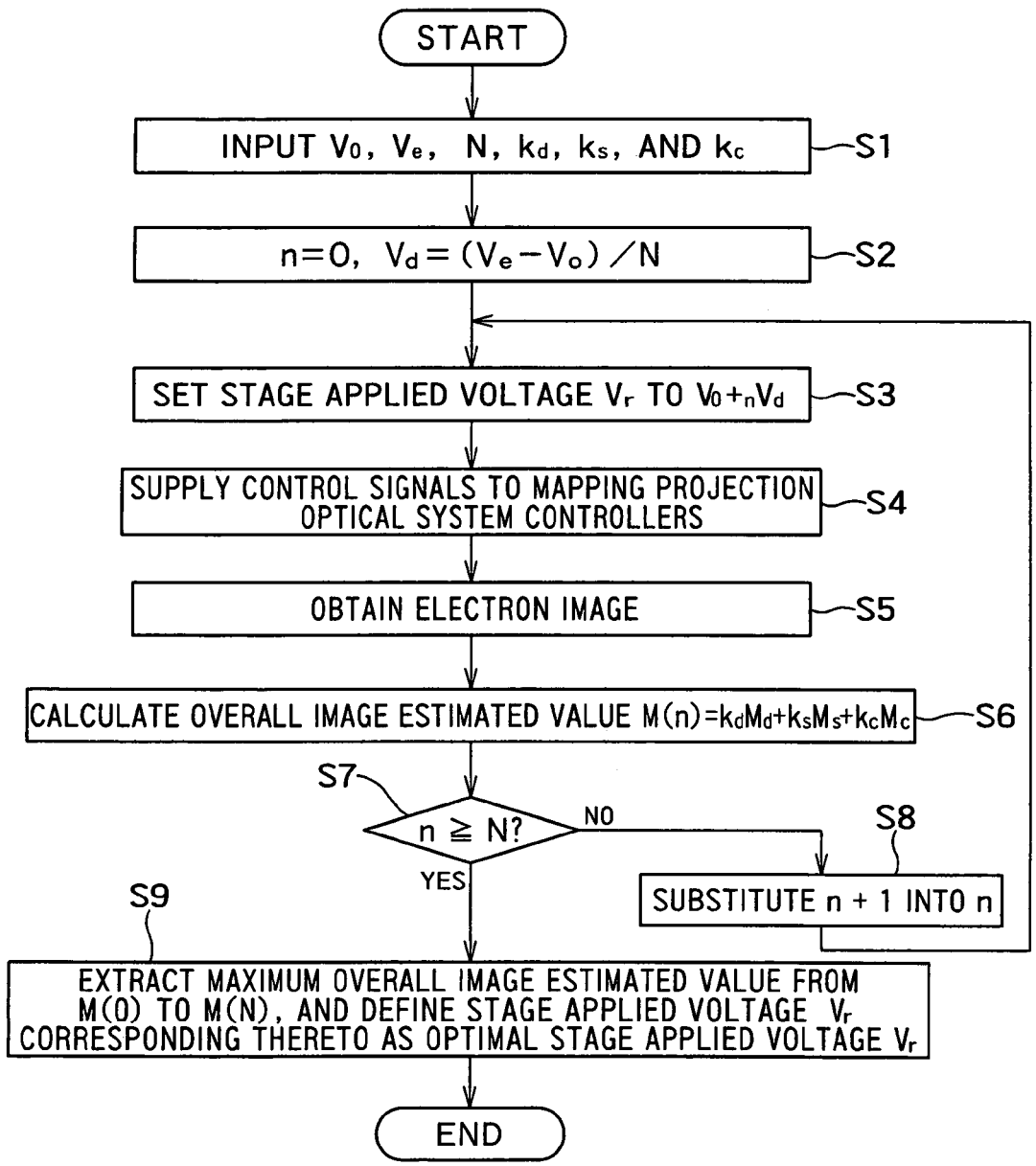
FIG. 19 is a flowchart of the basic sequence of the substrate inspection method in accordance with the fifth embodiment of the present invention.

As shown in FIG. 19, a lower limit $V_0$ and an upper limit $V_e$ of an inspection range $V_0$ to $V_e$ of the stage applied voltage, a number of divisions N for that inspection range, and also weighting coefficients $k_d$, $k_s$, and $k_c$ corresponding to three image evaluation items (in other words, distortion, S/N ratio, and materials contrast) is first inputted to the image optimization condition input section 164 (step S1). These three weighting coefficients $k_d$, $k_s$, and $k_c$ are set so as to achieve what is thought to be the optimal detected image for each inspection. The image optimization condition inspection instruction section 164 then sets n to zero, calculates the stage applied voltage optimal condition inspection resolution $V_d = (V_e - V_0)/N$ (step S2), and outputs a control signal to the stage voltage controller 51 such that a stage applied voltage of $Vr = V_0 + nVd$ (in this case, n=0 so $Vr = V_0$) is applied to the stage 43 (step S3). Control signals are also supplied to the various mapping projection optical system controllers 52 to 57 to ensure that the various mapping optical system control voltages or currents corresponding to this stage applied voltage Vr are set (step S4), an image of the surface of the specimen S is obtained, and the corresponding image data is stored in the storage device MR2 (step S5). After the image of the specimen surface has been obtained, the image optimization condition inspection instruction section 164 outputs a control signal indicating that the image of the specimen surface has been obtained to the overall image estimated value calculator 166. On receiving that signal, the overall image estimated value calculator 166 extracts the specimen surface image from the storage device MR2, calculates an image distortion estimated value $M_d$, an image S/N estimated value $M_s$, and an image materials contrast estimated value $M_c$ based on that image, and also calculates the overall image estimated value M(n) ($=k_d M_d + k_s M_s + k_c M_c$) and stores it in the storage device MR2 (step S6). This estimated value calculation method is set beforehand to give an image that is suitable for inspection with large values of the image distortion estimated value $M_d$, image S/N estimated value $M_s$, and image materials contrast estimated value $M_c$. When the image optimization condition inspection instruction section 164 calculates the overall image estimated value M(n), the system determines whether or not the inspection has ended by comparing n and N (step S7). If n<N, it determines that the inspection has not ended and the image optimization condition inspection instruction section 164 substitutes n+1 into n (step S8), and the sequence of steps S3 to S7 is repeated. When n reaches N, it determines that the inspection has ended (step S7). The image optimization condition inspection instruction section 164 extracts the largest estimated value from the overall image estimated values M(0) to M(N), determines that the stage applied voltage Vr that was obtained at that largest image estimated value is the optimal stage applied voltage condition, and also determines that the inspection image obtained at that optimal stage applied voltage condition is the optimal condition image, then stores those values in the storage device MR2 (step S9) and ends the primary beam incident energy optimal condition inspection sequence.

In addition, the host computer 61 uses known image processing techniques on the optimal condition image obtained by the above-described sequence, to detect whether or not there are defects in the specimen S and, if a defect is detected, determines details such as the size and properties of that defect and outputs that information.

According to the thus-configured embodiment, there is calculated the image distortion estimated value $M_d$, image S/N estimated value $M_s$, and image materials contrast $M_c$ which are estimated values based on numerical values of distortion, S/N, and contrast evaluation characteristics; also set weighting coefficients $k_d$, $k_s$, and $k_c$ that are compatible with the object to be inspected and is calculated the overall image estimated value M(n) ($=k_d M_d + k_s M_s + k_c M_c$). Thus, it makes it possible to acquire primary beam incident energy conditions at which the optimal substrate surface image is obtained. Since this ensures that only reflected electrons (which have substantially the same energy after emission as the incident energy of the primary beam) are detected, this makes it possible to avoid the effects of local potential differences in the specimen surface, thus making it possible to obtain an inspection image that has little distortion and also a superior contrast. As a result, it is possible to detect the substrate surface image with a high level of sensitivity.

Sixth Embodiment

Figure 20:
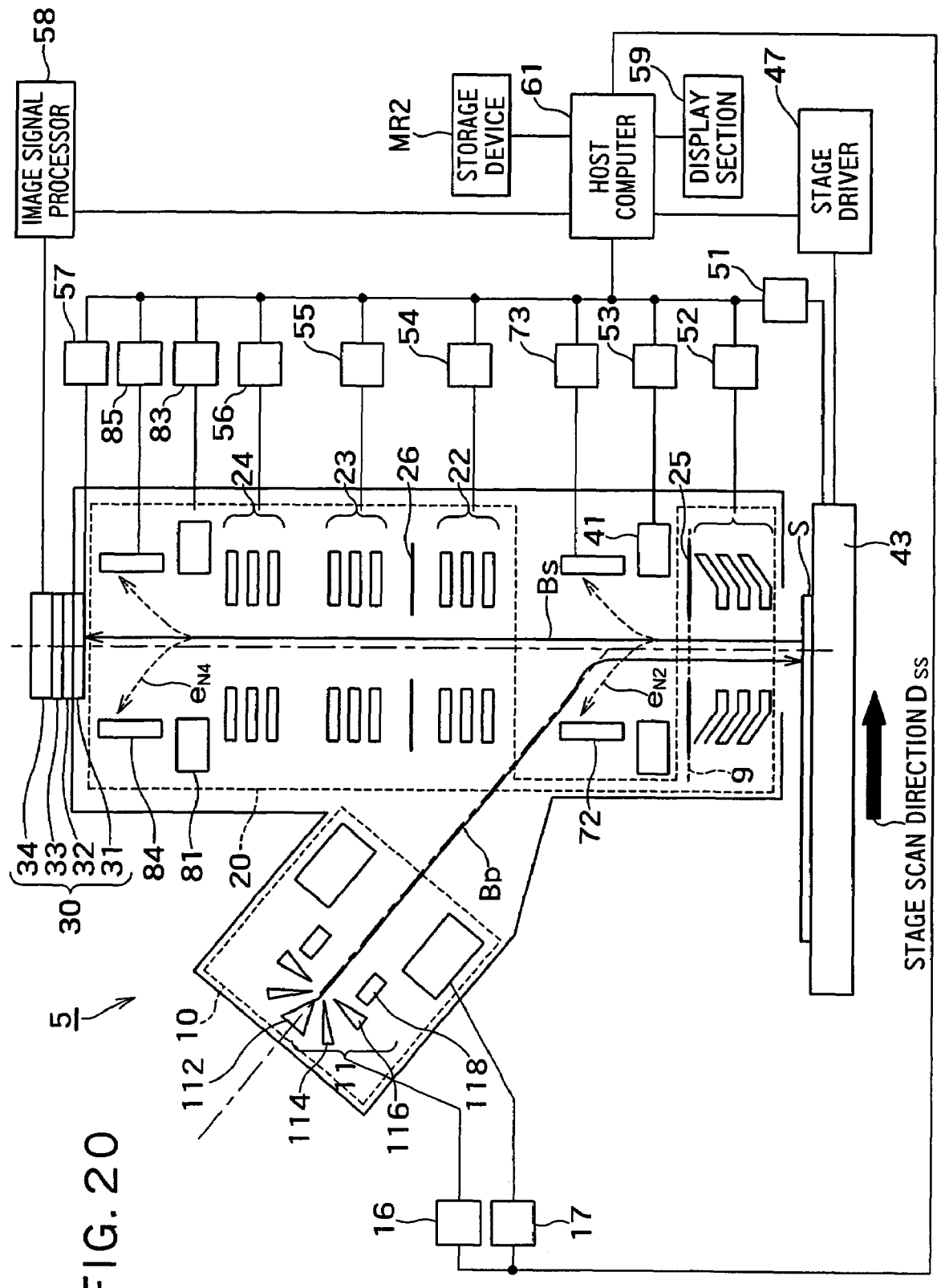
FIG. 20 is a block diagram of the basic configuration of a substrate inspection apparatus in accordance with a sixth embodiment of the present invention.

A block diagram of the basic configuration of a substrate inspection apparatus in accordance with a sixth embodiment of the present invention is shown in FIG. 20. In addition to the configuration shown in FIG. 17, a substrate inspection apparatus 5 comprises a Wien filter 81 that is separate from the Wien filter 41 that separates the primary beam Bp and the secondary beam Bs, a controller 83 therefor, noise electron trap electrodes 72 and 84, and controllers 73 and 85 for these noise electron trap electrodes. The Wien filter 81 is disposed between the fourth lens 24 and the MCP detector 31 within the secondary optical system. The Wien filters 41 and 81 are controlled by the corresponding Wien filter controllers 53 and 83 to ensure that reflected electrons, which have a high emission energy in comparison with the secondary electrons and thus make it possible to avoid distortion and contrast deterioration of the detected image, are passed through to form an image on the MCP detector 31. The noise electron trap electrode 72 is disposed between the Wien filter 41 and the second lens 22 and the noise electron trap electrode 84 is disposed between the Wien filter 81 and the MCP detector 31. The rest of the configuration of the substrate inspection apparatus 5 is substantially the same as that of the substrate inspection apparatus 4 of FIG. 17.

When reflected electrons are used for imaging the specimen surface, these reflected electrons have an emission magnitude that is smaller than that of the secondary electrons, but the energy spread is wider. Since that means that the proportion of noise electrons that arrive at the MCP detector 31 is large in comparison with the quantity of electrons used in the original imaging, a problem arises in that the S/N ratio of the detected image is large and thus deterioration occurs.

To solve such a problem, the Wien filter 41 of this embodiment also has the function of a filter for removing noise component electrons. In addition, the Wien filter 81 is disposed between the fourth lens 24 and the MCP detector 31. These Wien filters 41 and 81 are designed to cause the deflection of noise component electrons $e_{N2}$ and $e_{N4}$ so that they cannot arrive at the MCP detector 31. It should be noted, however, that the deflected noise component electrons $e_{N2}$ and $e_{N4}$ eventually irradiate the electrodes of the secondary optical system, contaminate the interior of the secondary optical system, and have an adverse effect on the electrical fields therein, leading to results that are not desirable to ignore. With this embodiment, positive voltages are applied by the noise electron trap electrode controllers 73 and 85 to the corresponding noise electron trap electrodes 72 and 84, this immobilizes the deflected noise component electrons in the noise electron trap electrodes 72 and 84, preventing contamination within the secondary optical system.

In this manner, since this embodiment is provided with the Wien filters 41 and 81 that deflect the noise component electrons $e_{N2}$ and $e_{N4}$ and the noise electron trap electrodes 72 and 84 that immobilize the thus-deflected noise component electrons $e_{N2}$ and $e_{N4}$, reflected electrons that have a high emission energy in comparison with the secondary electrons thus pass through the secondary optical system 20 as the secondary beam Bs and are imaged by the MCP detector 31, whereas noise electrons that are not these reflected electrons can be prevented from arriving at the MCP detector 31, it is possible to prevent distortion and contrast deterioration in the secondary electron beam inspection image. Note that the installation locations and electron trap electrodes do not necessarily conform to this embodiment. For example, if the Wien filter 41 alone can separate the primary beam Bp and the secondary beam Bs and also separate the reflected electrons that contribute to the imaging and the other noise electrons, it is not necessary to provide an additional Wien filter.

Seventh Embodiment

Figure 21:
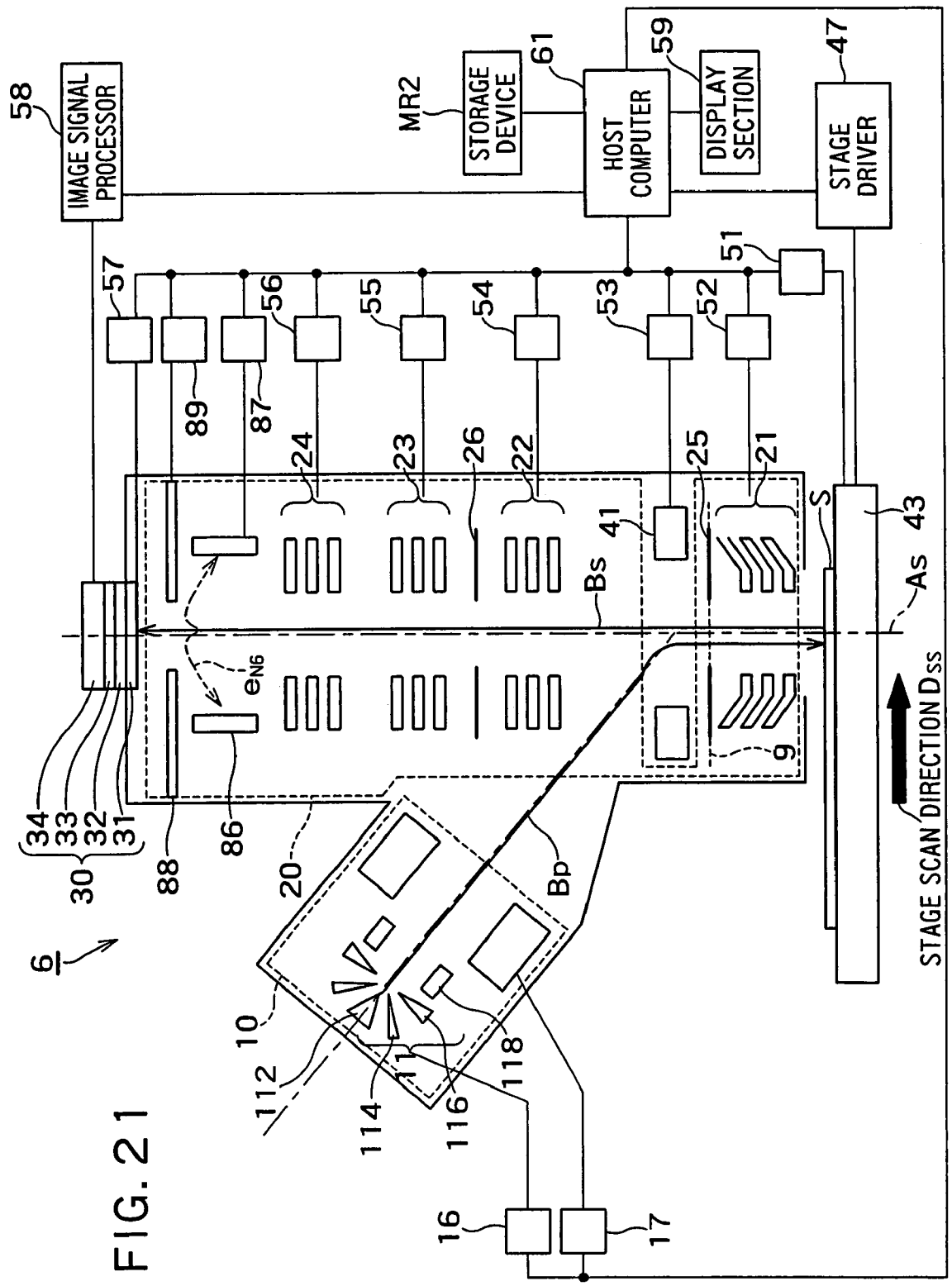
FIG. 21 is a block diagram of the basic configuration of a substrate inspection apparatus in accordance with a seventh embodiment of the present invention.
Figure 22:
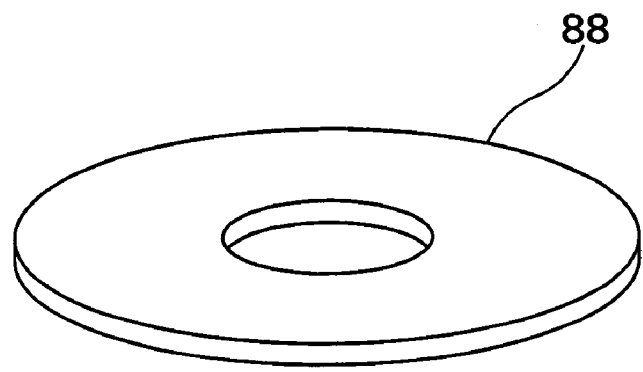
FIG. 22 is a perspective view of the noise electron shield electrode of the substrate inspection apparatus of FIG. 21.
Figure 23A:
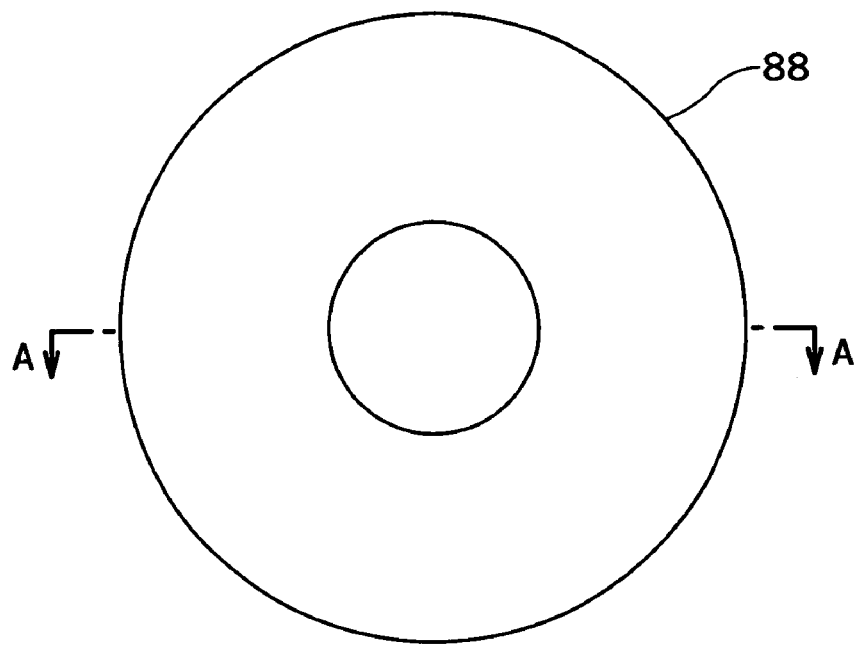
FIG. 23A is a plan view of the noise electron shield electrode of FIG. 21
Figure 23B:
FIG. 23B is a section through the noise electron shield electrode of FIG. 21.
Figure 24:
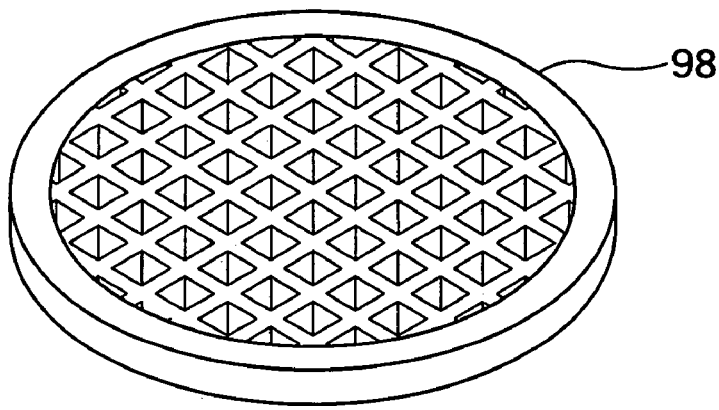
FIG. 24 is a perspective view of an example of a noise electron shield electrode of a grid (mesh) shape.
Figure 25A:
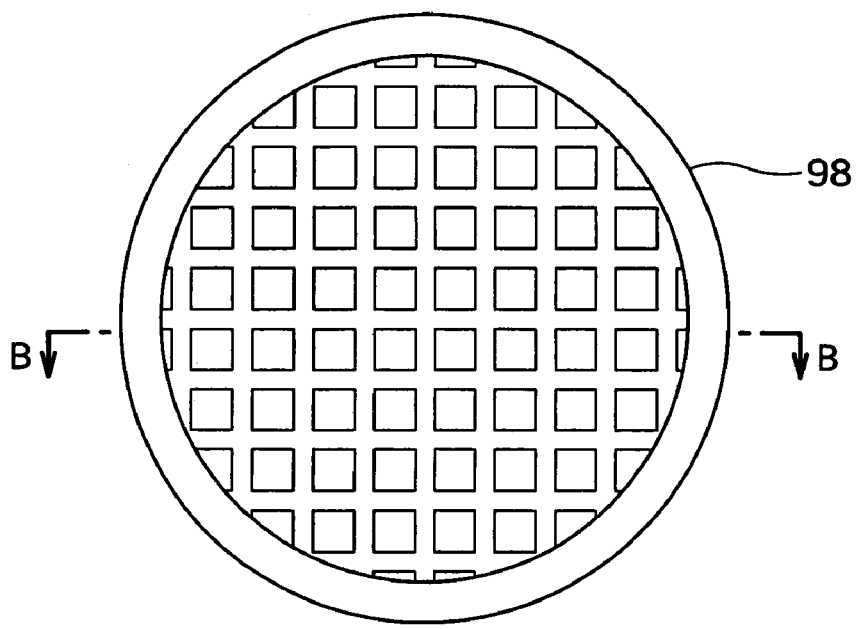
FIG. 25A is a plan view of the noise electron shield electrode of FIG. 24
Figure 25B:
FIG. 25B is a section through the noise electron shield electrode of FIG. 24.

A block diagram of the basic configuration of a substrate inspection apparatus in accordance with a seventh embodiment of the present invention is shown in FIG. 21. In addition to the configuration shown in FIG. 17, a substrate inspection apparatus 6 shown in FIG. 21 comprises a noise electron shield electrode 88, a noise electron shield electrode controller 89, a noise electron trap electrode 86, and a noise electron trap electrode controller 87. The noise electron shield electrode 88 is provided with a circular hole in the center that permits the secondary beam Bs to pass through, as shown in a perspective view of FIG. 22 together with a plan view and section there through of FIGS. 23A and 23B, it is disposed between the fourth lens 24 and the MCP detector 31 within the secondary optical system 20, and it is connected to the noise electron shield electrode controller 89 and a negative voltage is applied thereto. The value of this negative voltage is set to a value that enables the noise electron shield electrode 88 to excite a shielding electrical field to prevent the passage through the circular hole of the noise electron shield electrode 88 by noise component electrons $e_{N6}$ emitted from the specimen S at an energy below the energy of electrons that are used for imaging within the secondary beam Bs. The noise electron trap electrode 86 is disposed between the fourth lens 24 and the noise electron shield electrode 88, and is connected to the noise electron trap electrode controller 87 and a positive voltage is applied thereto. This ensures that noise component electrons $e_{N6}$ that have been deflected by the shield electrical field excited by the noise electron shield electrode 88 are immobilized in the noise electron trap electrode 86, preventing contamination of the secondary optical system 20. This embodiment is suitable for cases in which emitted electrons having substantially the same energy as the energy incident on the specimen S by the primary beam Bp, in other words, reflected electrons, are used for imaging. Note that the installation locations and numbers of the noise electron shield electrode 88 and the noise electron trap electrode 86 do not necessarily conform to the configuration shown in FIG. 21, in a similar manner to the above-described sixth embodiment. In addition, the noise electron shield electrode 88 of this embodiment has been described as having a circular hole shape, but the shape of the noise electron shield electrode is not limited thereto and thus it could have a grid (mesh) shape formed in a lattice pattern, as shown by way of example as an electrode 98 in a perspective view of FIG. 24 together with a plan view and section there through of FIGS. 25A and 25B.

Eighth Embodiment

Figure 26:
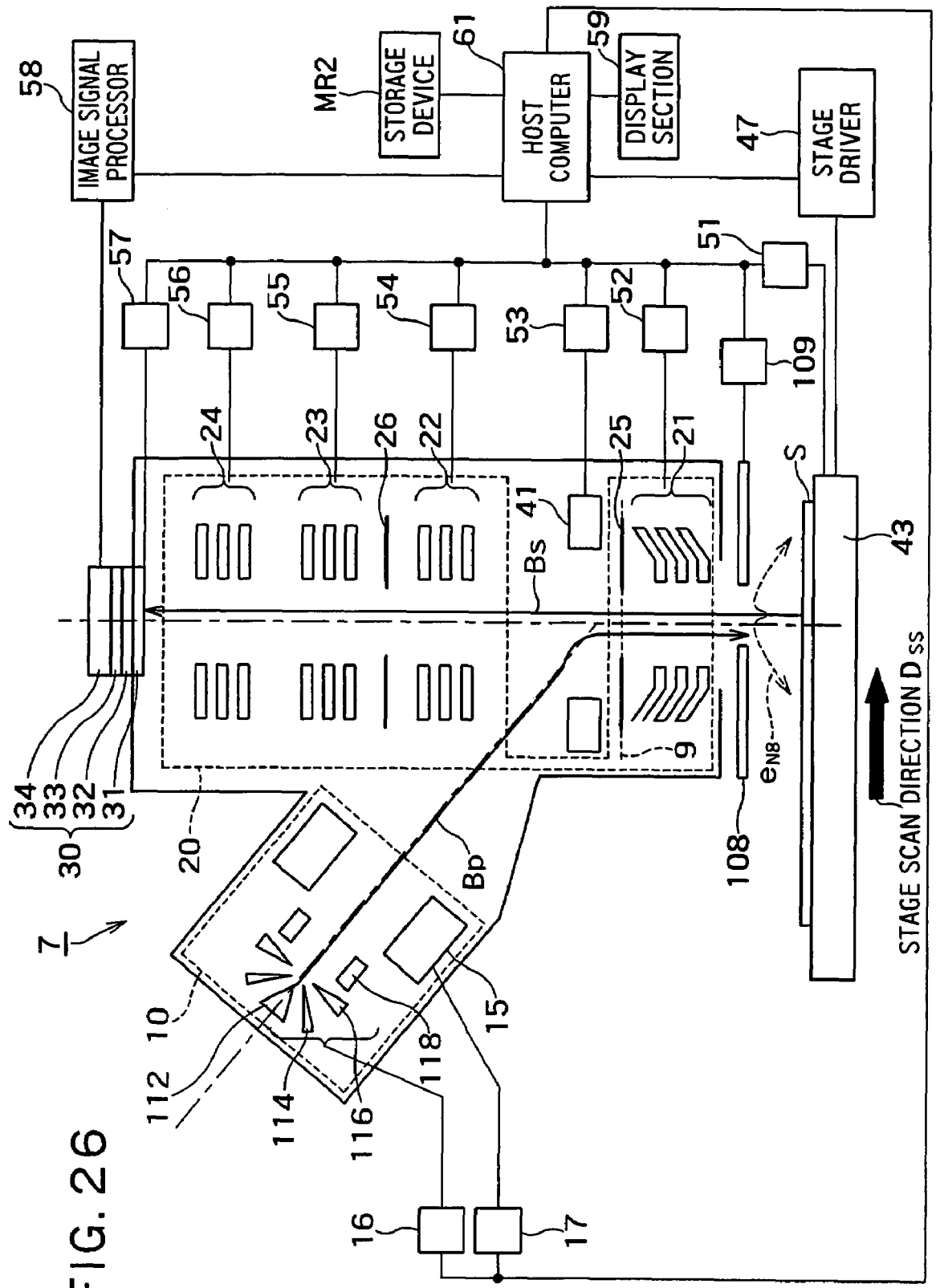
FIG. 26 is a block diagram of the basic configuration of a substrate inspection apparatus in accordance with an eighth embodiment of the present invention.
Figure 27:
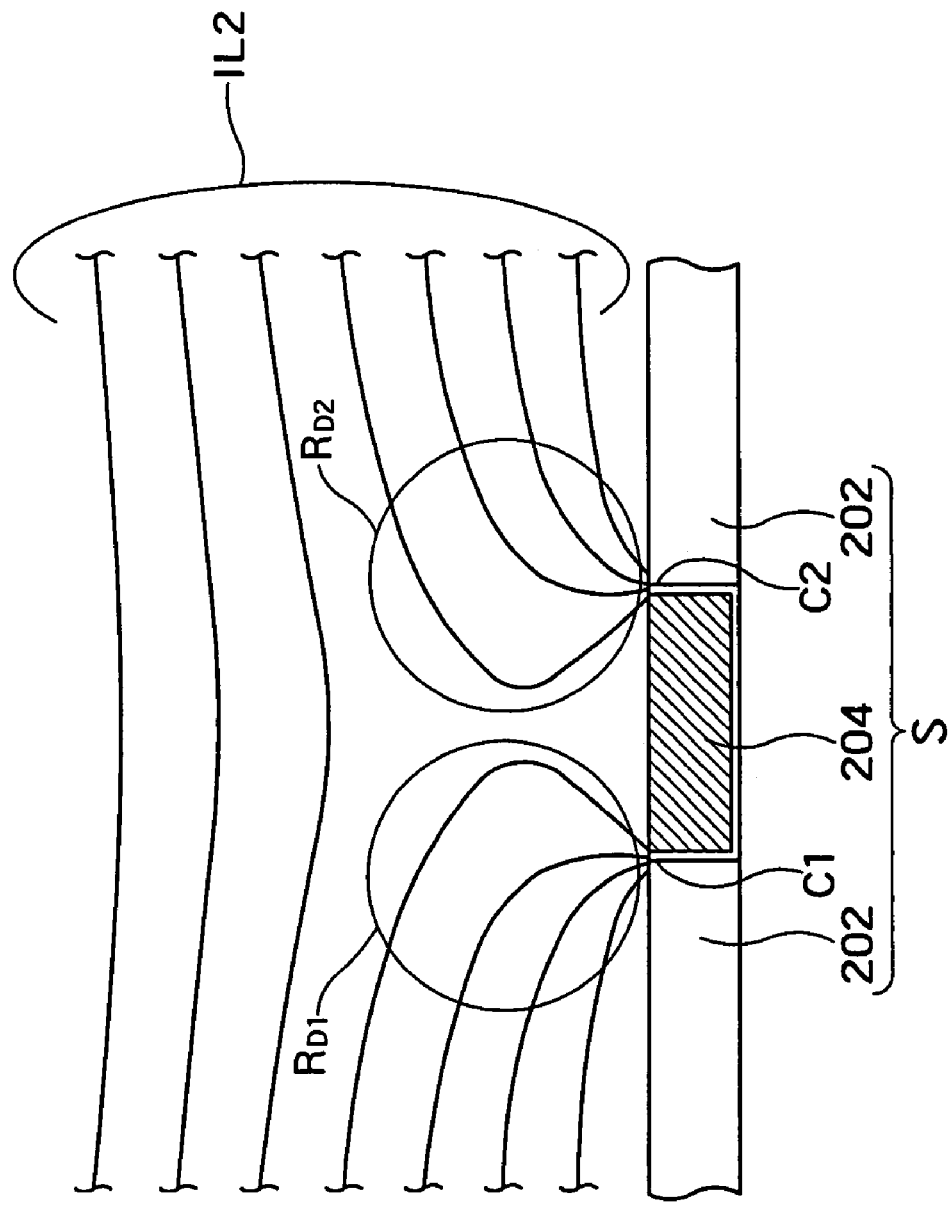
FIG. 27 illustrates a problem with a substrate inspection method in accordance with a conventional technique.

A block diagram of the basic configuration of a substrate inspection apparatus in accordance with an eighth embodiment of the present invention is shown in FIG. 26. In addition to the configuration shown in FIG. 17, a substrate inspection apparatus 7 shown in FIG. 26 comprises a noise electron shield electrode 108 and a noise electron shield electrode controller 109. The noise electron shield electrode 108 is an electrode having a circular hole shape disposed between the specimen S and the secondary optical system 20 (see FIGS. 22 and 12), it is connected to the noise electron shield electrode controller 109 and has a negative voltage applied thereto. The value of this negative voltage is set to a value that enables the noise electron shield electrode 108 to excite a shielding electrical field to prevent the passage through the circular hole of the noise electron shield electrode 108 by noise component electrons $e_{N8}$ emitted from the specimen S at an energy below the energy of electrons that are used for imaging within the secondary beam Bs, in a similar manner to the above-described seventh embodiment. Since this prevents the noise component electrons $e_{N8}$ from arriving at the MCP detector 31, it makes it possible to reduce the noise component at the MCP detector 31.

The disposition of the noise electron shield electrode 108 between the specimen S and the secondary optical system 20 in this manner has two further advantages, as follows:

1) It makes it possible to prevent contamination of the secondary optical system due to noise component electrons, without providing a noise component electron trap electrode such as that of the above-described sixth and seventh embodiments.
2) It reduces local charging of the specimen surface by redistributing the noise component electrons that have been turned back by the noise electron shield electrode 108 towards positively charged locations on the surface of the specimen S, such as the insulator regions.

This reduces local potential differences of the specimen surface, making it possible to control distortion and contrast deterioration of the detected image. Note that the shape of the noise electron shield electrode 108 is not limited to a circular hole shape and thus it is similar to the above-described seventh embodiment in that it could have the grid (mesh) shape shown in FIGS. 24, 25A, and 25B, by way of example.

Method of Manufacturing Semiconductor Device

Since the use of above-described substrate inspection process during the process of manufacturing a semiconductor device makes it possible to inspect substrates with a high level of accuracy, it makes it possible to manufacture semiconductor device at a higher yield.

The present invention has been described above with reference to embodiments thereof, but the present invention is not limited to those embodiments and it should be clear to those skilled in the art that various modifications are possible within the scope thereof. For example, the above embodiments were described as relating to a substrate inspection apparatus that uses a stage-scanning method, but the present invention could of course be applied to a substrate inspection apparatus using a deflector for a beam-scanning method, and even to a substrate inspection apparatus that comprises both of these scanning methods.

What is claimed is:

1. A substrate inspection apparatus comprising:
an electron beam irradiation device which emits an electron beam and causes the electron beam to irradiate a substrate to be inspected as a primary beam;
an electron beam detector which detects at least one of a secondary electron, a reflected electron and a backscattered electron that are generated from the substrate that has been irradiated by the electron beam, and which outputs a signal that forms a one-dimensional or two-dimensional image of a surface of the substrate;
a mapping projection optical system which causes imaging of at least one of the secondary electron, the reflected electron and the backscattered electron on said electron beam detector as a secondary beam; and
an electromagnetic wave irradiation device which provides a location on the surface of the substrate at which the secondary beam is generated, with energy to thereby migrate a local charge within the substrate by generating an electromagnetic wave and causing the electromagnetic wave to irradiate the location.

2. The substrate inspection apparatus according to claim 1, wherein said electromagnetic wave irradiation device causes the electromagnetic wave to irradiate the location on the surface of the substrate so that a first area on the surface of the substrate irradiated by the electromagnetic wave overlaps a second area on the surface of the substrate irradiated by the primary beam.

3. The substrate inspection apparatus according to claim 1, wherein said electromagnetic wave irradiation device causes the electromagnetic wave to irradiate the location on the surface of the substrate substantially simultaneously with the irradiation of the primary beam.

4. A substrate inspection apparatus comprising:
an electron beam irradiation device which emits an electron beam and causes the electron beam to irradiate a substrate to be inspected as a primary beam;
an electron beam detector which detects at least one of a secondary electron, a reflected electron and a backscattered electron that are generated from the substrate that has been irradiated by the electron beam, and which outputs a signal that forms a one-dimensional or two-dimensional image of a surface of the substrate;
a mapping projection optical system which causes imaging of at least one of the secondary electron, the reflected electron and the backscattered electron on said electron beam detector as a secondary beam; and
an electromagnetic wave irradiation device which generates an electromagnetic wave and causes the electromagnetic wave to irradiate a location on the surface of the substrate at which the secondary beam is generated, wherein a wavelength of the electromagnetic wave is defined on the basis of a band gap or localized level of a material of the surface of the substrate.

5. A substrate inspection apparatus comprising:
an electron beam irradiation device which emits an electron beam and causes the electron beam to irradiate a substrate to be inspected as a primary beam;
an electron beam detector which detects at least one of a secondary electron, a reflected electron and a backscattered electron that are generated from the substrate that has been irradiated by the electron beam, and which outputs a signal that forms a one-dimensional or two-dimensional image of a surface of the substrate;
a mapping projection optical system which causes imaging of at least one of the secondary electron, the reflected electron and the backscattered electron on said electron beam detector as a secondary beam; and
an electromagnetic wave irradiation device which generates an electromagnetic wave and causes the electromagnetic wave to irradiate a location on the surface of the substrate at which the secondary beam is generated, wherein the substrate has a surface layer formed of a plurality of different materials contacting each other at a contact region in the surface layer, and a wavelength of the electromagnetic wave is defined on the basis of a potential barrier at the contact region.

6. A substrate inspection method comprising:
emitting an electron beam and causing the electron beam to irradiate a substrate to be inspected as a primary beam;
projecting at least one of a secondary electron, a reflected electron and a backscattered electron that are generated from the substrate that has been irradiated by the electron beam, as a secondary beam to cause imaging of the secondary beam;
detecting an image caused by said imaging of the secondary beam and outputting a signal to form a one-dimensional or two-dimensional image of a surface of the substrate; and
providing a location on the surface of the substrate at which the secondary beam is generated, with energy to thereby migrate a local charge within the substrate by irradiating the location with an electromagnetic wave.

7. The substrate inspection method according to claim 6, wherein a first area on the surface of the substrate irradiated by the electromagnetic wave overlaps a second area on the surface of the substrate irradiated by the primary beam.

8. The substrate inspection method according to claim 6, wherein the irradiation of the electromagnetic wave is implemented substantially simultaneously with the irradiation of the primary beam.

9. A substrate inspection method comprising:
emitting an electron beam and causing the electron beam to irradiate a substrate to be inspected as a primary beam;

projecting at least one of a secondary electron, a reflected electron, and a backscattered electron that are generated from the substrate that has been irradiated by the electron beam, as a secondary beam to cause imaging of the secondary beam;

detecting an image caused by said imaging of the secondary beam and outputting a signal to form a one-dimensional or two-dimensional image of a surface of the substrate; and generating an electromagnetic wave and causing the electromagnetic wave to irradiate a location on the surface of the substrate at which the secondary beam is generated;

wherein a wavelength of the electromagnetic wave is defined on the basis of a band gap or localized level of a material of the surface of the substrate.

10. A substrate inspection method comprising:

emitting an electron beam and causing the electron beam to irradiate a substrate to be inspected as a primary beam, the substrate having a surface layer formed of a plurality of different materials contacting each other;

projecting at least one of a secondary electron, a reflected electron, and a backscattered electron that are generated from the substrate that has been irradiated by the electron bean, as a secondary beam to cause imaging of the secondary beam;

detecting an image caused by said imaging of the secondary beam and outputting a signal to form a one-dimensional or two-dimensional image of a surface of the substrate; and generating an electromagnetic wave and causing the electromagnetic wave to irradiate a location on the surface of the substrate at which the secondary beam is generated;

wherein a wavelength of the electromagnetic wave is defined on the basis of a potential barrier in a region of the surface layer in which the plurality of different materials contact each other.

\* \* \* \* \*